(12) United States Patent
Nagase et al.

(10) Patent No.: US 9,978,882 B2
(45) Date of Patent: May 22, 2018

(54) METHOD OF MANUFACTURING SEMICONDUCTOR DEVICE AND GLASS FILM FORMING APPARATUS

(71) Applicant: SHINDENGEN ELECTRIC MANUFACTURING CO., LTD., Chiyoda-ku, Tokyo (JP)

(72) Inventors: Shinichi Nagase, Hanno (JP); Atsushi Ogasawara, Hanno (JP); Koji Ito, Hanno (JP)

(73) Assignee: SHINDENGEN ELECTRIC MANUFACTURING CO., LTD., Chiyoda-ku, Tokyo (JP)

( * ) Notice: Subject to any disclaimer, the term of this patent is extended or adjusted under 35 U.S.C. 154(b) by 0 days. days.

(21) Appl. No.: 15/108,554

(22) PCT Filed: Nov. 13, 2014

(86) PCT No.: PCT/JP2014/080041
§ 371 (c)(1),
(2) Date: Jun. 27, 2016

(87) PCT Pub. No.: WO2016/075787
PCT Pub. Date: May 19, 2016

(65) Prior Publication Data
US 2016/0322512 A1 Nov. 3, 2016

(51) Int. Cl.
*H01L 21/67* (2006.01)
*H01L 29/861* (2006.01)
(Continued)

(52) U.S. Cl.
CPC .......... *H01L 29/8613* (2013.01); *C25D 13/00* (2013.01); *H01L 21/02129* (2013.01);
(Continued)

(58) Field of Classification Search
CPC ... H01L 21/67126; C25D 13/00; C25D 13/02; C25D 17/001; C25D 17/10–17/12; C25D 11/32; C25D 9/04; C25D 7/12–7/126
See application file for complete search history.

(56) References Cited

U.S. PATENT DOCUMENTS 6,077,405 A * 6/2000 Biggs ..................... H05K 3/242
204/287
6,126,798 A * 10/2000 Reid ..................... C25D 17/10
204/199

(Continued)

FOREIGN PATENT DOCUMENTS

JP 2-163938 A 6/1990
JP 08222558 A * 8/1996 ........... H01L 21/316
(Continued)

OTHER PUBLICATIONS

International Search Report dated Feb. 17, 2015, issued in corresponding International Application No. PCT/JP2014/080041, filed Nov. 13, 2014, 5 pages.

*Primary Examiner* — Joshua King
(74) *Attorney, Agent, or Firm* — Christensen O'Conner Johnson Kindness PLLC

(57) ABSTRACT

Provided is a method of manufacturing a semiconductor device according to the present invention, a ring-shaped electrode plate 18 with an opening having a diameter smaller than a diameter of a semiconductor wafer W is disposed between a first electrode plate 14 and a second electrode plate 16, the semiconductor wafer W is arranged between the ring-shaped electrode plate 18 and the second electrode plate 16, and a glass film is formed on a glass film forming scheduled surface in a state where a potential lower than a potential V2 of the second electrode plate 16 is applied to the ring-shaped electrode plate 18. According to the method of manufacturing a semiconductor device of the present inven- (Continued)

tion, even when the glass film forming step is performed using the semiconductor wafer where the base insulating film is formed on the glass film forming scheduled surface as the semiconductor wafer, lowering of deposition efficiency of fine glass particles on the outer peripheral portion of the semiconductor wafer can be suppressed and hence, highly reliable semiconductor devices can be manufactured with high productivity.

9 Claims, 16 Drawing Sheets

(51) Int. Cl.
| | | |
|---|---|---|
| H01L 21/762 | (2006.01) | |
| H01L 21/78 | (2006.01) | |
| H01L 29/06 | (2006.01) | |
| H01L 29/66 | (2006.01) | |
| H01L 21/02 | (2006.01) | |
| C25D 13/00 | (2006.01) | |

(52) U.S. Cl.
CPC .. *H01L 21/02142* (2013.01); *H01L 21/02145* (2013.01); *H01L 21/02161* (2013.01); *H01L 21/02282* (2013.01); *H01L 21/67126* (2013.01); *H01L 21/76224* (2013.01); *H01L 21/78* (2013.01); *H01L 29/0649* (2013.01); *H01L 29/66128* (2013.01); *H01L 29/66136* (2013.01); *H01L 29/8611* (2013.01)

(56) References Cited

U.S. PATENT DOCUMENTS

| | | | | |
|---|---|---|---|---|
| 6,156,167 A * | 12/2000 | Patton | ...................... | C25D 7/12 204/270 |
| 6,159,354 A * | 12/2000 | Contolini | ............. | C25D 17/001 205/137 |
| 6,179,983 B1 * | 1/2001 | Reid | ...................... | C25D 7/123 204/227 |
| 6,194,239 B1 * | 2/2001 | Tayanaka | .......... | H01L 21/02381 257/E21.102 |
| 6,214,701 B1 * | 4/2001 | Matsushita | ......... | H01L 21/2007 257/E21.122 |
| 6,331,208 B1 * | 12/2001 | Nishida | ................... | C30B 25/18 117/89 |
| 6,350,609 B1 * | 2/2002 | Morozov | ............ | B01J 19/0046 205/158 |
| 6,391,743 B1 * | 5/2002 | Iwane | ............... | H01L 21/67092 136/243 |
| RE37,749 E * | 6/2002 | Poris | ................... | H01L 21/2885 204/224 R |
| 6,562,204 B1 * | 5/2003 | Mayer | ...................... | C25D 5/18 204/229.8 |
| 6,669,833 B2 * | 12/2003 | Kaja | ...................... | C25D 17/007 204/224 R |
| 6,679,441 B1 * | 1/2004 | Borra | .................... | B05B 5/0255 239/690 |
| 6,827,827 B2 * | 12/2004 | Nakamoto | ............. | H05K 3/241 204/230.2 |
| 6,896,784 B2 * | 5/2005 | Cheng | ...................... | C25D 5/02 205/118 |
| 8,268,155 B1 * | 9/2012 | Zhou | ........................ | C25D 3/38 205/123 |
| RE45,687 E * | 9/2015 | Saito | ...................... | C25D 21/10 |
| 2002/0187571 A1 * | 12/2002 | Collins, III | ............ | C25D 13/02 438/29 |
| 2004/0055894 A1 * | 3/2004 | Iwasaki | .................. | C25D 11/32 205/157 |
| 2004/0262150 A1 * | 12/2004 | Yajima | ................... | C25D 21/12 204/224 R |
| 2005/0089645 A1 * | 4/2005 | Keigler | ................... | C25D 21/12 427/443.1 |
| 2006/0110536 A1 * | 5/2006 | Keigler | ................... | C25D 21/12 427/256 |
| 2008/0150975 A1 * | 6/2008 | Ueno | ................... | B41J 2/04576 347/9 |
| 2009/0230222 A1 * | 9/2009 | Kim | ........................ | B05B 5/001 239/690.1 |
| 2009/0301395 A1 * | 12/2009 | Sekimoto | ............... | C25D 5/022 118/668 |
| 2010/0116672 A1 * | 5/2010 | Mayer | ................. | C23C 18/1601 205/97 |
| 2012/0043216 A1 * | 2/2012 | Arvin | ....................... | C25D 5/04 205/261 |
| 2012/0043301 A1 * | 2/2012 | Arvin | ................... | C25D 17/007 216/86 |
| 2013/0154064 A1 * | 6/2013 | Ogasawara | ............ | C03C 3/066 257/650 |
| 2014/0312472 A1 | 10/2014 | Ogasawara et al. | | |
| 2015/0155446 A1 * | 6/2015 | Stoll | ...................... | B05B 5/005 438/29 |

FOREIGN PATENT DOCUMENTS

| | | | |
|---|---|---|---|
| JP | 2004-87955 A | 3/2004 | |
| WO | 2013/168314 A1 | 11/2013 | |
| WO | WO 2013168237 A1 * | 11/2013 | ........... H01L 23/291 |

* cited by examiner

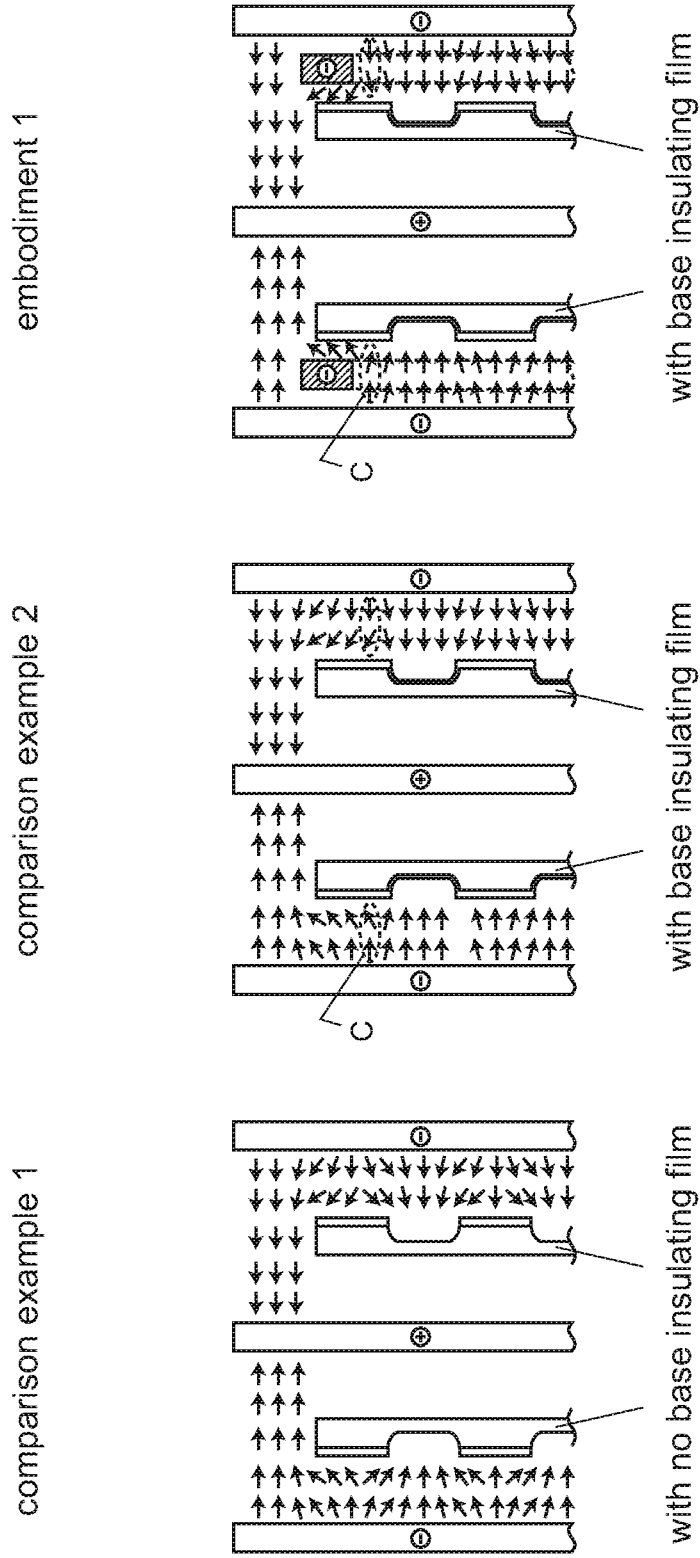

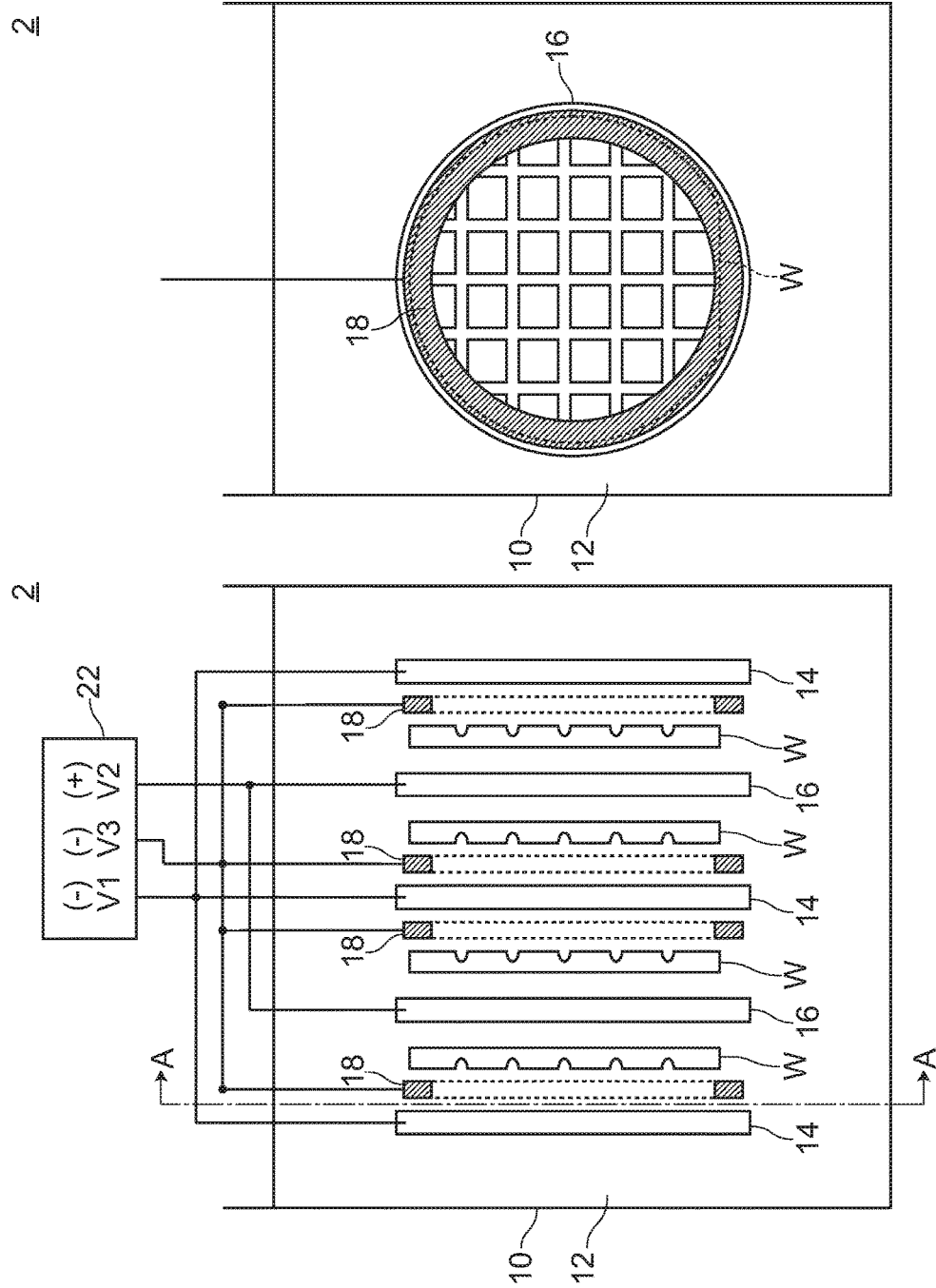

specimen 1 specimen 2 specimen 3 specimen 4

METHOD OF MANUFACTURING SEMICONDUCTOR DEVICE AND GLASS FILM FORMING APPARATUS

TECHNICAL FIELD

The present invention relates to a method of manufacturing a semiconductor device and a glass film forming apparatus.

BACKGROUND ART

Conventionally, there has been known a method of manufacturing a semiconductor device which includes a glass film forming step where a glass film is formed on a surface of a semiconductor wafer by electrophoresis (see patent literature 1, for example). The conventional method of manufacturing a semiconductor device includes, as shown in FIG. 15A to FIG. 15D and FIG. 16A to FIG. 16D, "semiconductor wafer preparing step", "glass film forming step", "oxide film removing step", "roughened surface region forming step", "electrode forming step", and "semiconductor wafer cutting step" in this order. Hereinafter, the conventional method of manufacturing a semiconductor device is explained in the order of steps.

(a) Semiconductor Wafer Preparing Step

Firstly, a $p^+$ type diffusion layer 912 is formed by diffusing a p type impurity from one surface of an $n^-$ type semiconductor wafer ($n^-$ type silicon wafer) 910, and an $n^+$ type diffusion layer 914 is formed by diffusing an n type impurity from the other surface of the $n^-$ type semiconductor wafer 910 thus forming a semiconductor wafer having a pn junction parallel to a main surface of the semiconductor wafer. Thereafter, oxide films 916, 918 are formed by thermal oxidation on a surface of the $p^+$ type diffusion layer 912 and a surface of the $n^+$ type diffusion layer 914 respectively (see FIG. 15A).

Next, a predetermined opening portion is formed on the oxide film 916 at a predetermined position by photo etching. After etching the oxide film, subsequently, the semiconductor wafer is etched thus forming a trench 920 having a depth which goes beyond the pn junction as measured from one surface of the semiconductor wafer (see FIG. 15B).

(b) Glass Film Forming Step

Next, a glass film 924 is formed on an inner surface of the trench 920 and a surface of the semiconductor wafer in the vicinity of the trench 920 by electrophoresis, and the glass film 924 is densified by being baked (see FIG. 15C).

In the conventional method of manufacturing a semiconductor device, in forming the glass film 924 by electrophoresis, as shown in FIG. 17, a first electrode plate 14 connected to a minus terminal and a second electrode plate 16 connected to a plus terminal are disposed so as to oppositely face each other in the inside of a tank 10 in which a suspension formed by suspending fine glass particles in a solvent is stored in a state where the first electrode plate 14 and the second electrode plate 16 are immersed in the suspension, and the glass film 924 is formed on a glass film forming scheduled surface (an inner surface of the trench in FIG. 17) by electrophoresis in a state where the semiconductor wafer W is disposed between the first electrode plate 14 and the second electrode plate 16 in a posture where the glass film forming scheduled surface is directed toward a first electrode plate 14 side. As fine glass particles, for example, lead borosilicate glass which contains PbO, $B_2O_3$ and $SiO_2$ as main components is used.

(c) Oxide Film Removing Step

Next, a photoresist 926 is formed so as to cover a surface of the glass film 924. Thereafter, the oxide film 916 is etched using the photoresist 926 as a mask so that the oxide film 916 at a portion 930 where a Ni-plating electrode film is to be formed is removed (see FIG. 15D and FIG. 16A).

(d) Roughened Surface Region Forming Step

Next, a surface of the semiconductor wafer at the portion 930 where the Ni-plating electrode film is to be formed is subjected to surface roughening treatment thus forming a roughened surface region 932 for enhancing adhesiveness between a Ni plating electrode and the semiconductor wafer (see FIG. 16B).

(e) Electrode Forming Step

Next, Ni plating is applied to the semiconductor wafer thus forming an anode electrode 934 on the roughened surface region 932 and forming a cathode electrode 936 on the other surface of the semiconductor wafer (see FIG. 16C).

(f) Semiconductor Wafer Cutting Step

Next, the semiconductor wafer is cut by dicing or the like at a center portion of the glass film 924 thus dividing the semiconductor wafer into chips whereby mesa semiconductor devices (pn diodes) are manufactured (see FIG. 16D).

According to the conventional method of manufacturing a semiconductor device, the semiconductor wafer is cut after the glass film 924 is formed in the inside of the trench 920 and hence, highly reliable mesa semiconductor devices can be manufactured.

PRIOR ART LITERATURE

Patent Literature

Patent Literature 1: JP-A-2004-87955
Patent Literature 2: International Publication 2013/168314

SUMMARY OF THE INVENTION

Technical Problem

With respect to the conventional method of manufacturing a semiconductor device, to prevent the increase of a leak current in a semiconductor device in a BT test (High-Temperature-Reverse-Bias) or the like, the inventors of the present invention have proposed the performing of a glass film forming step which uses, as a semiconductor wafer, a semiconductor wafer where a base insulating film is formed on a glass film forming scheduled surface (see patent literature 2, for example).

However, as a result of studies made by the inventors of the present invention, the followings has been found. That is, when the glass film forming step is performed using, as the semiconductor wafer, a semiconductor wafer which forms a base insulating film on a glass film forming scheduled surface, deposition efficiency of fine glass particles is lowered on an outer peripheral portion of the semiconductor wafer and hence, there may be case where insulation property (reverse direction characteristic) of a semiconductor device separated by cutting from the outer peripheral portion of the semiconductor wafer is lowered thus giving rise to a possibility that reliability of the semiconductor device is lowered. As a result, it becomes difficult to manufacture highly reliable semiconductor devices over the whole surface of the semiconductor wafer and hence, there exists a drawback that highly reliable semiconductor devices cannot be manufactured with high productivity.

The present invention has been made to overcome such drawbacks, and it is an object of the present invention to provide a method of manufacturing a semiconductor device and a glass film forming apparatus which can manufacture highly reliable semiconductor devices with high productivity even when a glass film forming step is performed using, as a semiconductor wafer, a semiconductor wafer where a base insulating film is formed on a glass film forming scheduled surface.

Solution to Problem

[1] The method of manufacturing a semiconductor device according to the present invention is a method of manufacturing a semiconductor device which includes: a semiconductor wafer preparing step of preparing a semiconductor wafer where a base insulating film is formed on a glass film forming scheduled surface; and a glass film forming step of forming a glass film on a glass film forming scheduled surface by electrophoresis in a state where a first electrode plate and a second electrode plate are disposed so as to opposedly face each other in the inside of a tank in which a suspension formed by suspending fine glass particles in a solvent is stored in a state where the first electrode plate and the second electrode plate are immersed in the suspension, and the semiconductor wafer is disposed between the first electrode plate and the second electrode plate in a posture where the glass film forming scheduled surface is directed toward a first electrode plate side, wherein in the glass film forming step, a ring-shaped electrode plate having an opening which has a diameter smaller than a diameter of the semiconductor wafer is disposed between the first electrode plate and the second electrode plate, the semiconductor wafer is disposed between the ring-shaped electrode plate and the second electrode plate, and the glass film is formed on the glass film forming scheduled surface in a state where a potential which is biased more to a potential of the first electrode plate than to a potential of the second electrode plate is applied to the ring-shaped electrode plate.

[2] In the method of manufacturing a semiconductor device of the present invention, it is preferable that the glass film be formed on the glass film forming scheduled surface in a state where a potential equal to a potential of the first electrode plate be applied to the ring-shaped electrode plate.

[3] In the method of manufacturing a semiconductor device of the present invention, it is preferable that the glass film be formed on the glass film forming scheduled surface in a state where a potential between a potential of the first electrode plate and a potential of the second electrode plate be applied to the ring-shaped electrode plate.

[4] In the method of manufacturing a semiconductor device of the present invention, it is preferable that assuming the diameter of the semiconductor wafer as D1 (mm) and the diameter of the opening formed in the ring-shaped electrode plate as D2 (mm), the diameter D2 be set to a value which satisfies a relationship of "D1 (mm)−50 mm≤D2 (mm)≤D1 (mm)−1 mm".

[5] In the method of manufacturing a semiconductor device of the present invention, it is preferable that the ring-shaped electrode plate have an external shape which includes an imaginary circle having a diameter D3 (mm) which satisfies a relationship of "D1 (mm)≤D3 (mm)".

[6] In the method of manufacturing a semiconductor device of the present invention, it is preferable that the semiconductor wafer preparing step include: a step of preparing a semiconductor wafer having a pn junction parallel to a main surface thereof; a step of forming a trench having a depth which goes beyond the pn junction as measured from one surface of the semiconductor wafer and forming a pn junction exposed portion on an inner surface of the trench; and a step of forming the base insulating film on the inner surface of the trench such that the base insulating film covers the pn junction exposed portion.

[7] In the method of manufacturing a semiconductor device of the present invention, it is preferable that the semiconductor wafer preparing step include: a step of forming the pn junction exposed portion on a surface of the semiconductor wafer; and a step of forming the base insulating film on the surface of the semiconductor wafer such that the base insulating film covers the pn junction exposed portion.

[8] In the method of manufacturing a semiconductor device of the present invention, it is preferable that a film thickness of the base insulating film fall within a range of 5 nm to 60 nm.

[9] A glass film forming apparatus of the present invention is a glass film forming apparatus for forming a glass film by electrophoresis on a surface of a semiconductor wafer where a base insulating film is formed on a glass film forming scheduled surface, wherein the glass film forming apparatus includes: a tank in which a suspension formed by suspending fine glass particles in a solvent is stored; a first electrode plate and a second electrode plate which are disposed in the tank in a state where the first electrode plate and the second electrode plate opposedly face each other; a ring-shaped electrode plate which is disposed between the first electrode plate and the second electrode plate, and has an opening having a diameter smaller than a diameter of the semiconductor wafer; a semiconductor wafer arranging jig for arranging the semiconductor wafer at a predetermined position between the ring-shaped electrode plate and the second electrode plate; and a power source device which applies potentials to the first electrode plate, the second electrode plate and the ring-shaped electrode plate respectively such that the potential applied to the ring-shaped electrode plate is biased more to the potential of the first electrode plate than to the potential of the second electrode plate.

Advantageous Effects of Invention

According to the method of manufacturing a semiconductor device of the present invention, the ring-shaped electrode plate with the opening having a diameter smaller than a diameter of a semiconductor wafer is disposed between the first electrode plate and the second electrode plate, the semiconductor wafer is arranged between the ring-shaped electrode plate and the second electrode plate, and the glass film is formed on the glass film forming scheduled surface in a state where a potential being more biased to a potential of the first electrode plate than to a potential of the second electrode plate is applied to the ring-shaped electrode plate (see FIG. 3 and FIG. 6 described later). Accordingly, on an outer peripheral portion of the semiconductor wafer, it is possible to correct the flow of fine glass particles toward the outer side of the semiconductor wafer in a radial direction to the flow of fine glass particles toward the glass film forming scheduled surface of the semiconductor wafer (see a portion indicated by symbol C in FIG. 5 and FIG. 9 described later). As a result, according to the method of manufacturing a semiconductor device of the present invention, even when the glass film forming step is performed using the semiconductor wafer where the base insulating film is formed on the glass film forming scheduled surface as the semiconductor wafer, lowering of deposition efficiency of fine glass particles on the outer peripheral portion of the semiconductor wafer can be suppressed and hence, highly reliable semiconductor devices can be manufactured with high productivity.

According to the glass film forming apparatus of the present invention, the ring-shaped electrode plate with the opening having a diameter smaller than a diameter of the semiconductor wafer is disposed between the first electrode plate and the second electrode plate, the semiconductor wafer is arranged between the ring-shaped electrode plate and the second electrode plate, and the glass film can be formed on the glass film forming scheduled surface in a state where a potential being biased more to a potential of the first electrode plate than to a potential of the second electrode plate is applied to the ring-shaped electrode plate (see FIG. 3 and FIG. 6 described later). Accordingly, on the outer peripheral portion of the semiconductor wafer, it is possible to correct the flow of fine glass particles toward the outer side of the semiconductor wafer in a radial direction to the flow of fine glass particles toward the glass film forming scheduled surface of the semiconductor wafer (see a portion indicated by symbol C in FIG. 5 and FIG. 9 described later). As a result, according to the glass film forming apparatus of the present invention, even when the glass film forming step is performed using the semiconductor wafer where the base insulating film is formed on the glass film forming scheduled surface as the semiconductor wafer, lowering of deposition efficiency of fine glass particles on the outer peripheral portion of the semiconductor wafer can be suppressed and hence, highly reliable semiconductor device can be manufactured with high productivity.

A view for explaining a method of manufacturing a semiconductor device according to an embodiment 1.

FIG. 1A to FIG. 1D are views showing respective steps of the method of manufacturing a semiconductor device according to the embodiment 1.

FIG. 2

A view for explaining the method of manufacturing a semiconductor device according to the embodiment 1.

FIG. 2A to FIG. 2D are views showing respective steps of the method of manufacturing a semiconductor device according to the embodiment 1.

FIG. 3

A view for explaining a glass film forming step in the method of manufacturing a semiconductor device according to the embodiment 1.

Figure 3B:
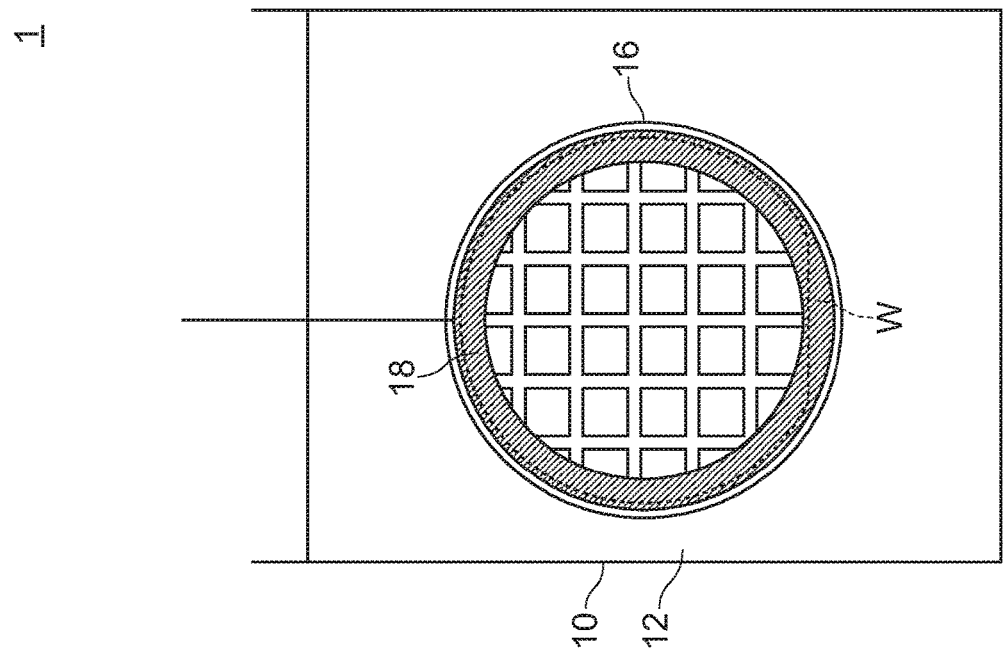
Figure 3A:
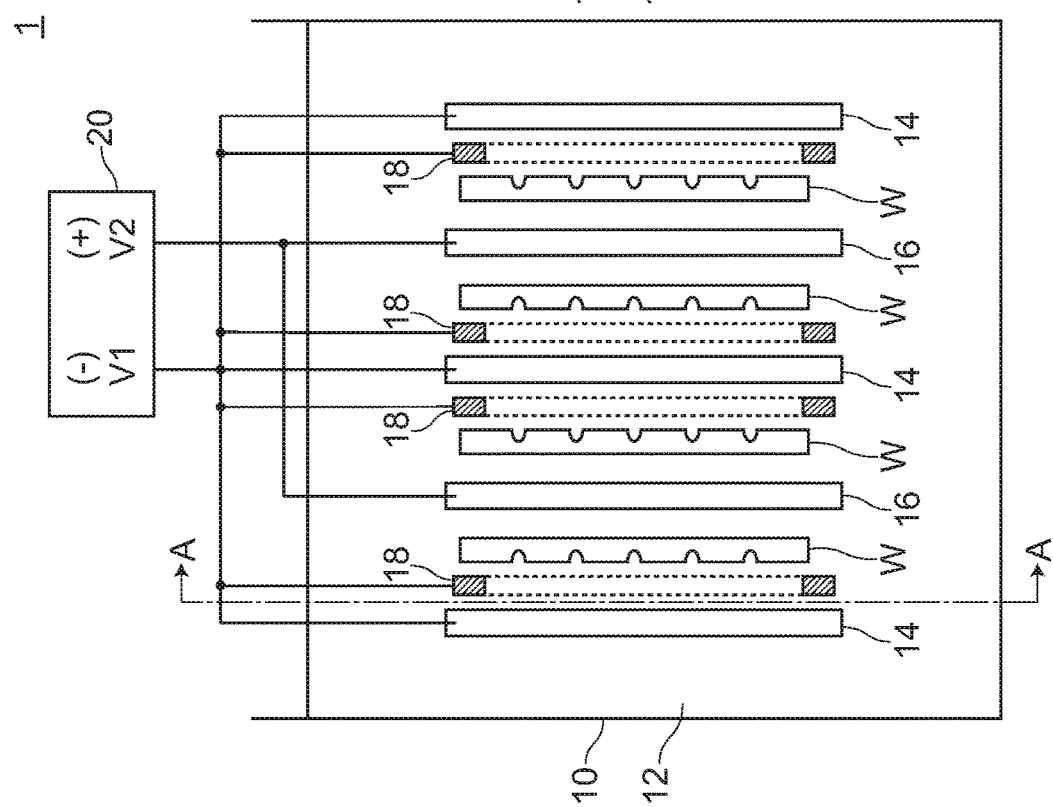

FIG. 3A is a cross-sectional view of a glass film forming apparatus 1 as viewed from a lateral direction, and FIG. 3B is a cross-sectional view of the glass film forming apparatus 1 taken along a line A-A in FIG. 3A.

FIG. 4

A view for explaining the structure of a ring-shaped electrode plate 18.

Figure 4A:
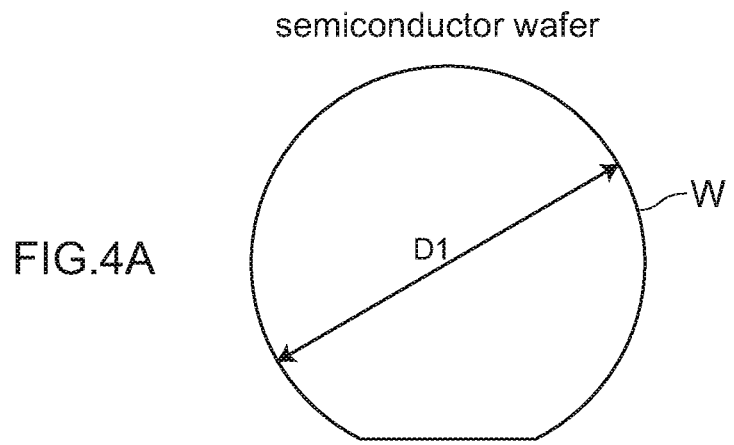
Figure 4B:
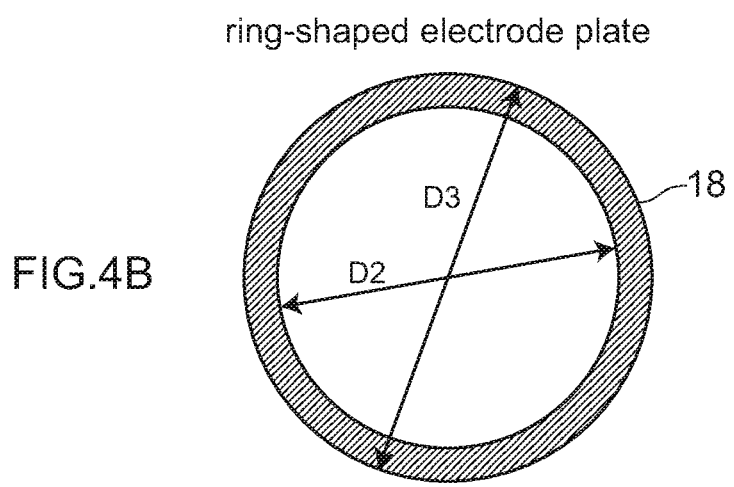
Figure 4C:
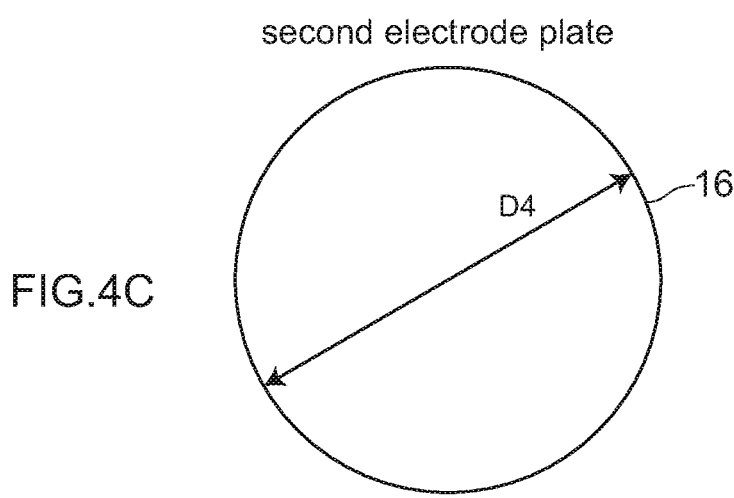

FIG. 4A is a view showing a diameter D1 of a semiconductor wafer W, FIG. 4B is a view showing a diameter D2 of an opening of a ring-shaped electrode plate 18 and an outer diameter D3 of the ring-shaped electrode plate 18, and FIG. 4C is a view showing a diameter D4 of the second electrode plate 16.

FIG. 5

A view for explaining the flow of fine glass particles in comparison examples 1 and 2 and the embodiment 1.

FIG. 5A is a view showing the flow of fine glass particles in the comparison example 1, FIG. 5B is a view showing the flow of fine glass particles in the comparison example 2, and FIG. 5C is a view showing the flow of fine glass particles in the embodiment 1.

FIG. 6

A view for explaining a glass film forming step in the method of manufacturing a semiconductor device according to an embodiment 2.

FIG. 6A is a cross-sectional view of a glass film forming apparatus 2 as viewed from a lateral direction, and FIG. 6B is a cross-sectional view of the glass film forming apparatus 2 taken along a line A-A in FIG. 6A.

FIG. 7

A view for explaining the method of manufacturing a semiconductor device according to an embodiment 3.

FIG. 7A to FIG. 7D are views showing respective steps of the method of manufacturing a semiconductor device according to the embodiment 3.

FIG. 8

A view for explaining a method of manufacturing a semiconductor device according to the embodiment 3.

FIG. 8A to FIG. 8D are views showing respective steps of the method of manufacturing a semiconductor device according to the embodiment 3.

FIG. 9

A view for explaining the flow of fine glass particles in comparison examples 3 and 4 and the embodiment 3.

Figure 9C:
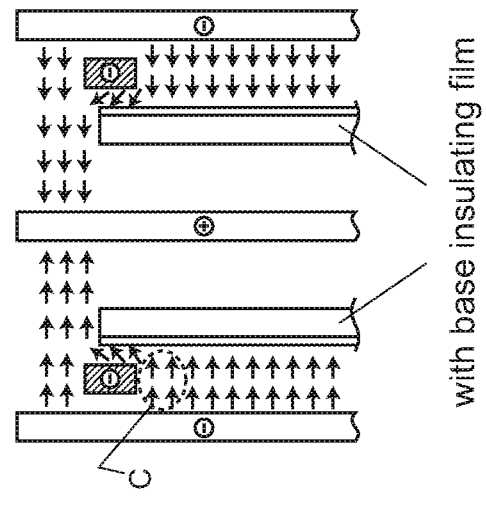
Figure 9B:
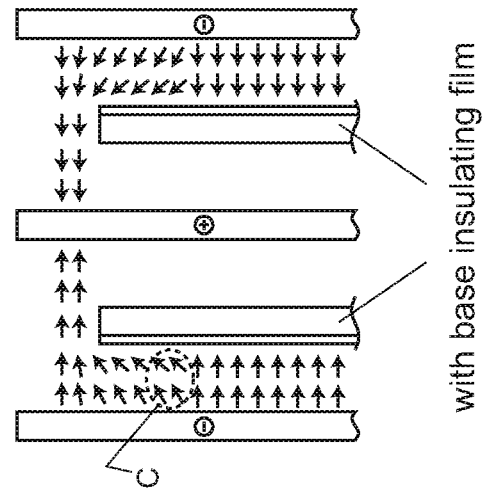
Figure 9A:
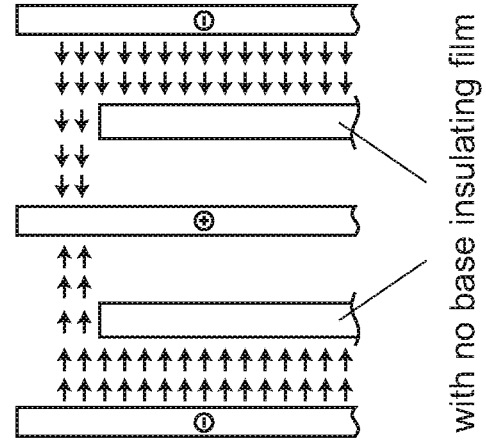

FIG. 9A is a view showing the flow of fine glass particles in the comparison example 3, FIG. 9B is a view showing the flow of fine glass particles in the comparison example 4, and FIG. 9C is a view showing the flow of fine glass particles in the embodiment 3.

FIG. 10

A view showing a result of test examples.

Figure 10A:
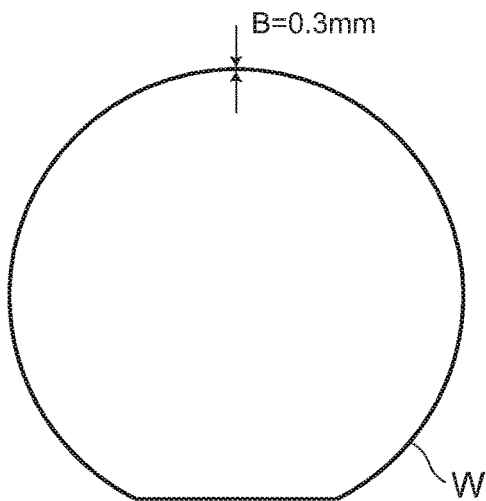
Figure 10B:
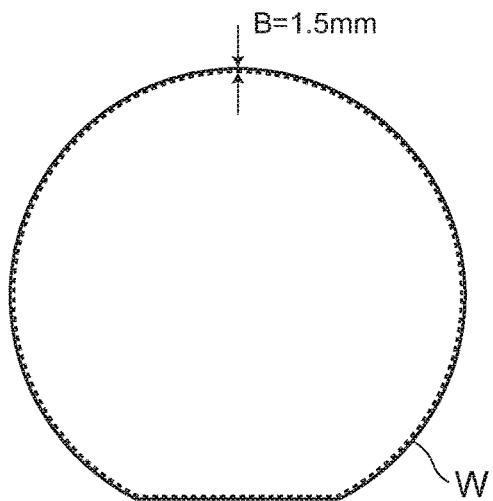

FIG. 10A is a view showing a result of a specimen 1 (example), and FIG. 10B is a view showing a result of a specimen 2 (comparison example).

FIG. 11

A view showing a result of test examples.

Figure 11A:
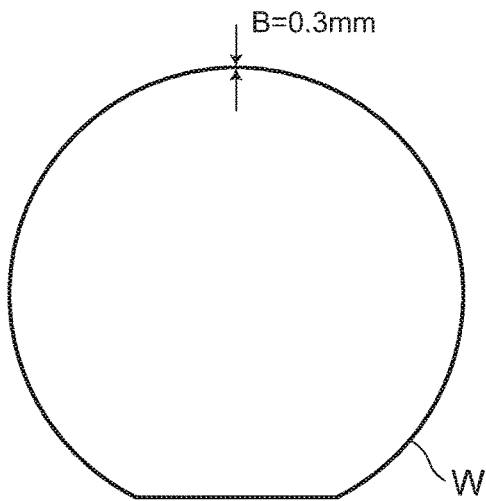
Figure 11B:
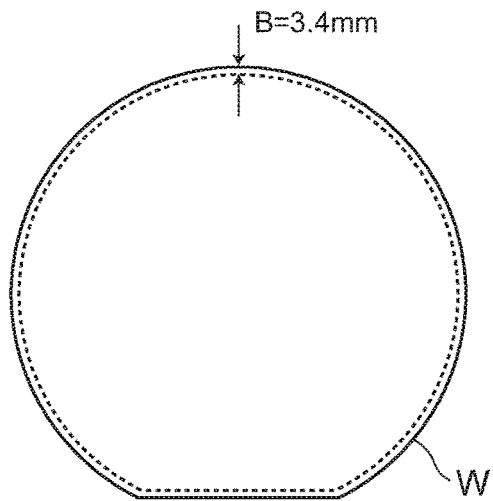

FIG. 11A is a view showing a result of specimen 3 (example), and FIG. 11B is a view showing a result of specimen 4 (comparison example).

FIG. 12

A view for explaining a modification of a ring-shaped electrode plate.

Figure 12A:
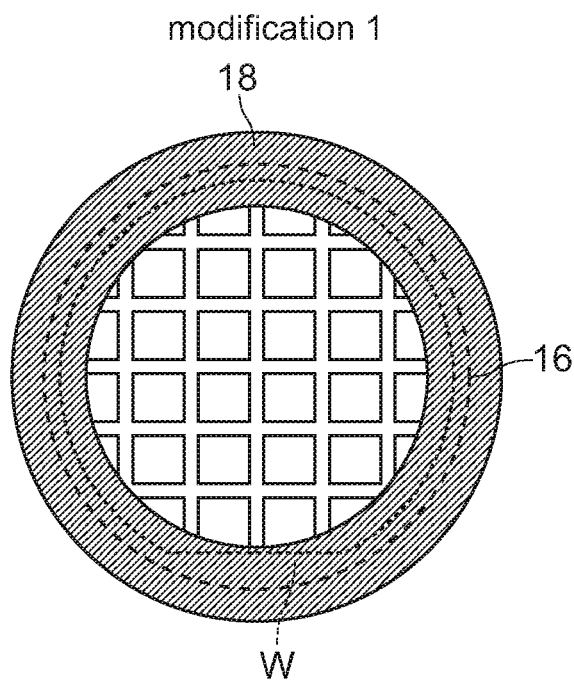
Figure 12B:
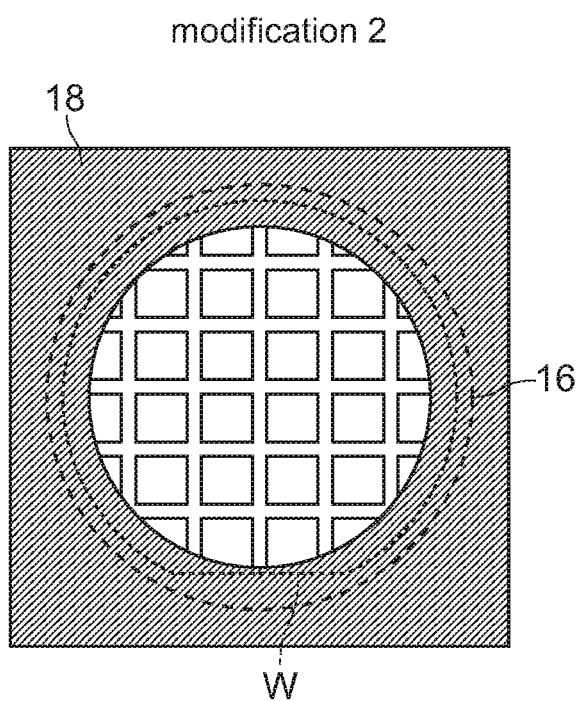

FIG. 12A and FIG. 12B are views showing respective modifications (modifications 1 and 2).

FIG. 13

A view for explaining a range of potential V3 applied to the ring-shaped electrode plate.

Figure 13A:
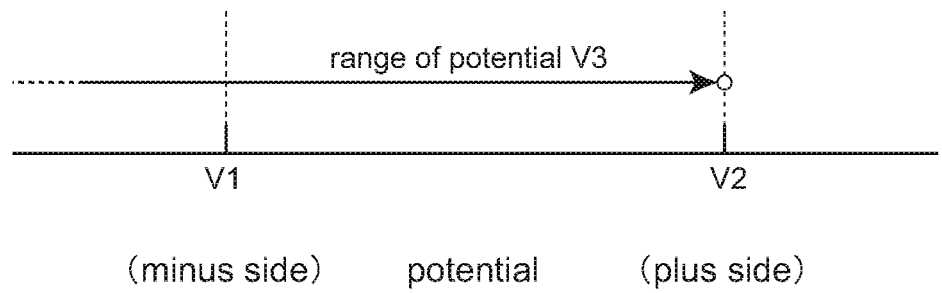
Figure 13B:
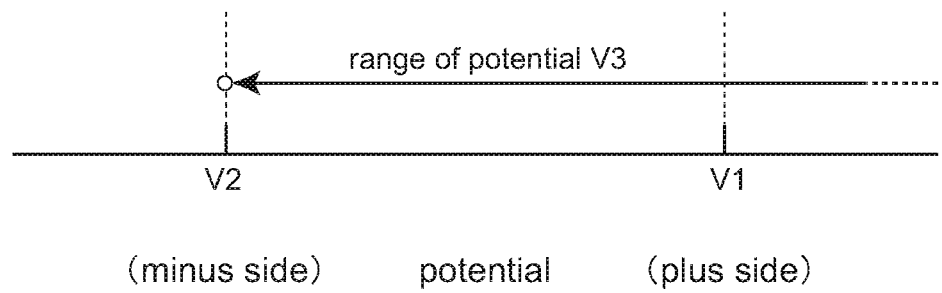
Figure 14A:
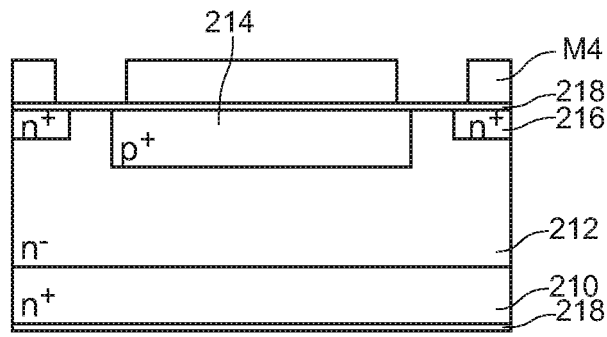
Figure 14B:
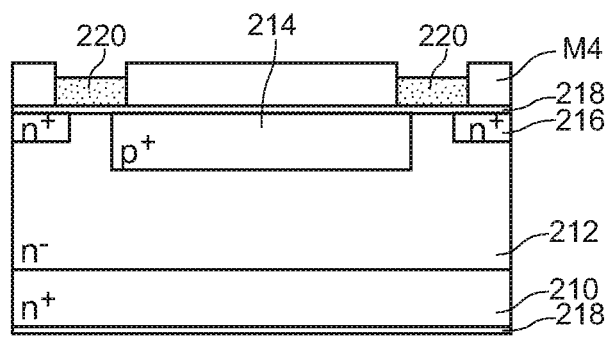
Figure 14C:
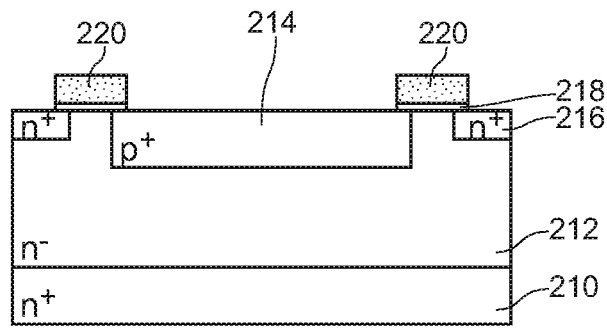
Figure 14D:
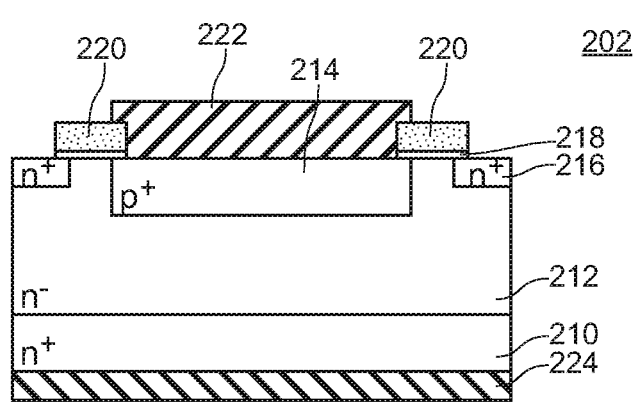
Figure 15A:
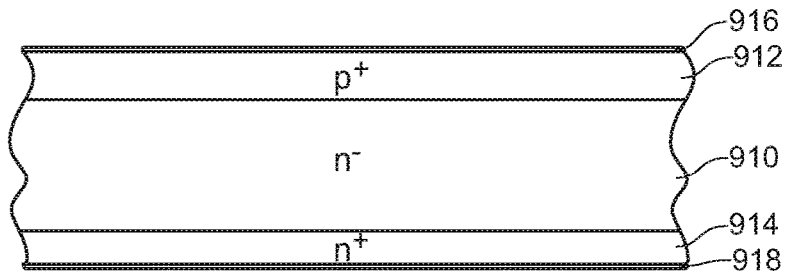
Figure 15B:
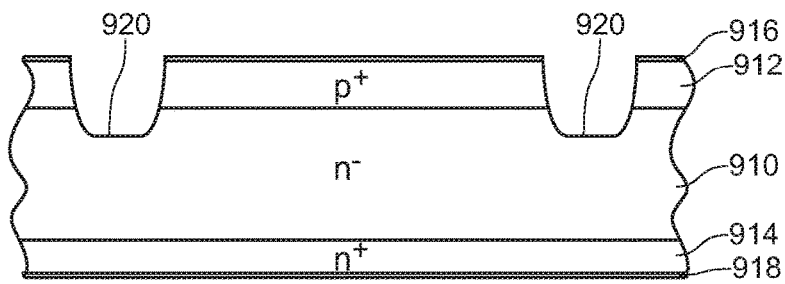
Figure 15C:
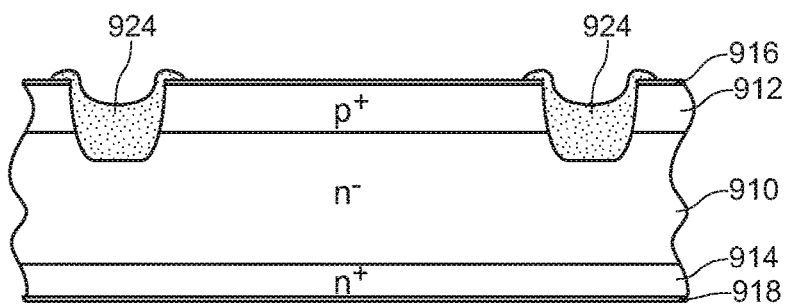
Figure 15D:
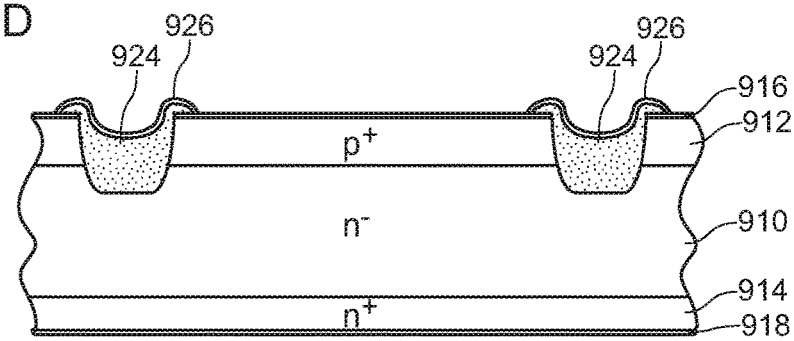
Figure 16A:
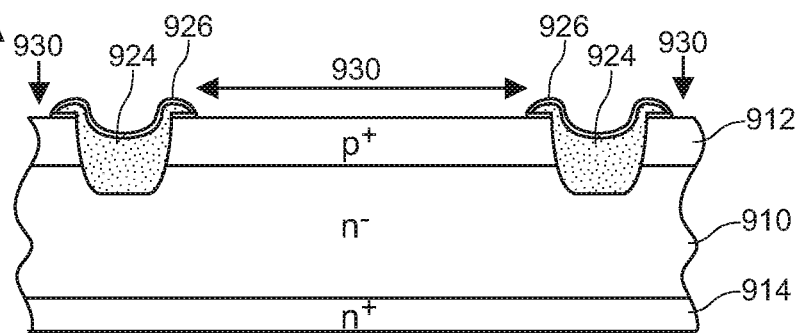
Figure 16B:
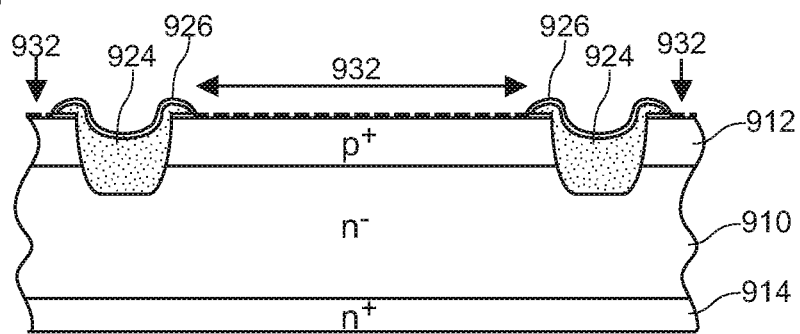
Figure 16C:
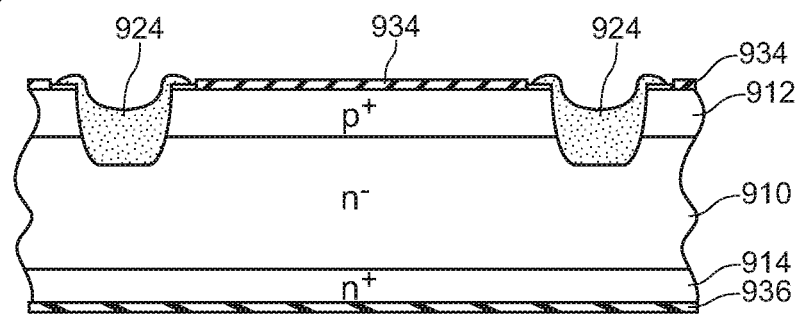
Figure 16D:
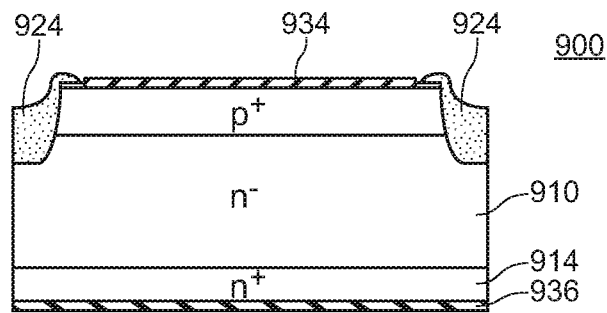

FIG. 13A is a view for explaining the range of the potential V3 when a potential V1 of a first electrode plate is set as a minus potential and a potential V2 of a second electrode plate is set as a plus potential, and FIG. 13B is a view showing a range of the potential V3 when the potential V1 of the first electrode plate is set as a plus potential and a potential V2 of the second electrode plate is set as a minus potential.

FIG. 14

A view for explaining a method of manufacturing a semiconductor device according to a modification 3.

FIG. 14A to FIG. 14D are views showing respective steps of the method of manufacturing a semiconductor device according to the modification 3.

FIG. 15

A view for explaining a conventional method of manufacturing a semiconductor device.

FIG. 15A to FIG. 15D are views showing respective steps of the conventional method of manufacturing a semiconductor device.

FIG. 16

A view for explaining a conventional method of manufacturing a semiconductor device.

FIG. 16A to FIG. 16D are views showing respective steps of the conventional method of manufacturing a semiconductor device.

FIG. 17

A view for explaining a glass film forming step in a conventional method of manufacturing a semiconductor device.

Figure 17B:
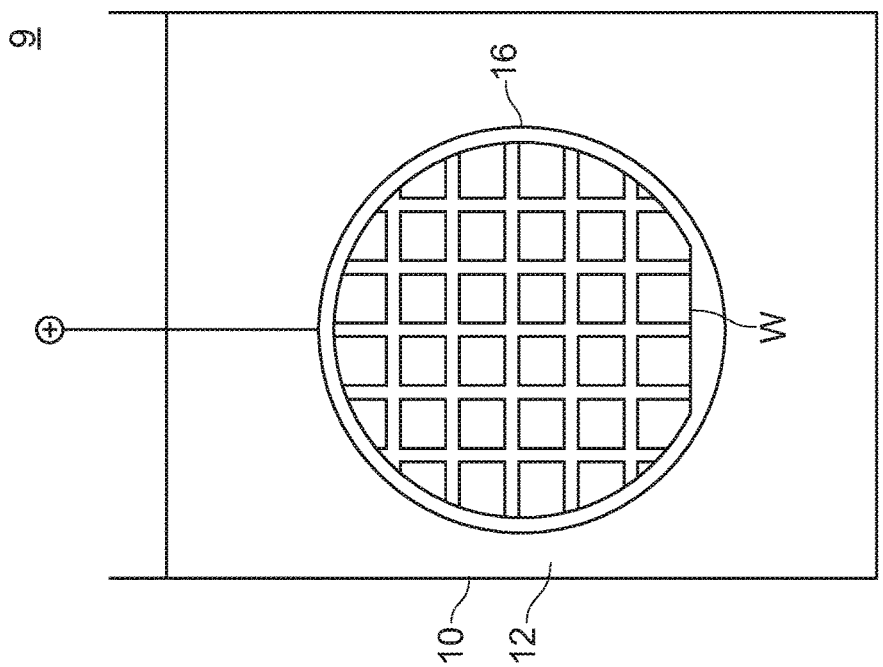
Figure 17A:
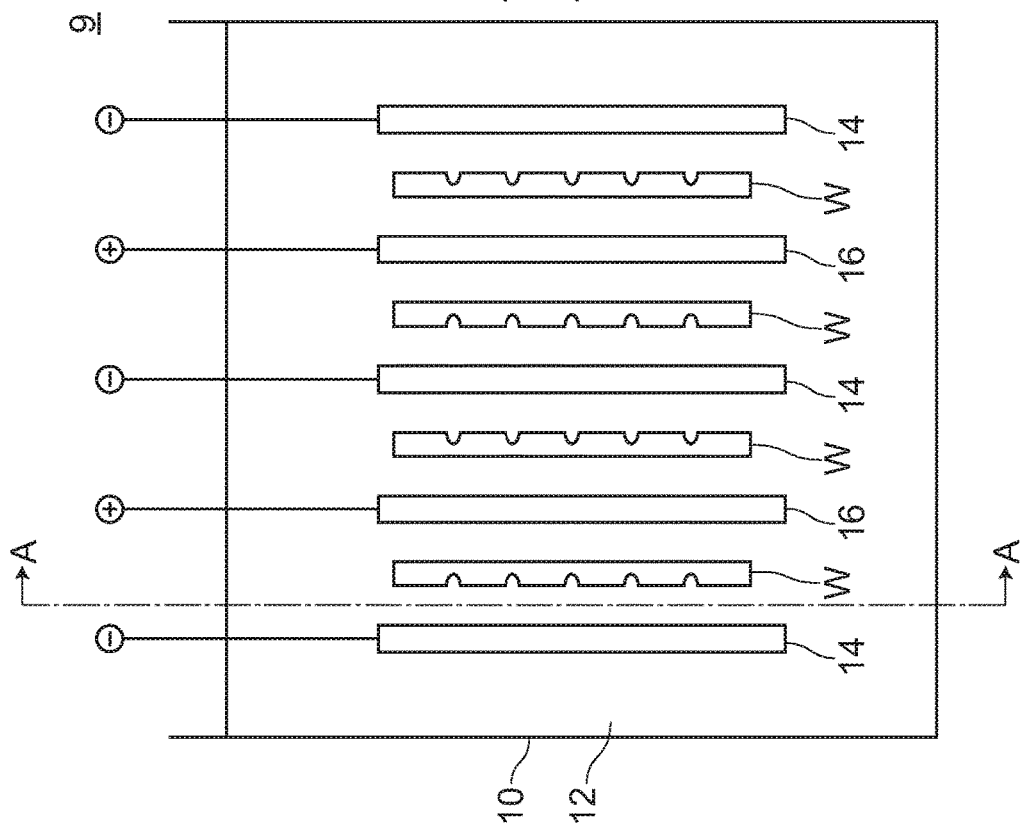

FIG. 17A is a cross-sectional view of a glass film forming apparatus 9 as viewed from a lateral direction, and FIG. 17B is a cross-sectional view of the glass film forming apparatus 9 taken along a line A-A in FIG. 17A.

DESCRIPTION OF EMBODIMENTS

Hereinafter, a method of manufacturing a semiconductor device and a glass film forming apparatus of the present invention are explained based on embodiments shown in the drawings.

Embodiment 1

The method of manufacturing a semiconductor device according to an embodiment 1 includes, as shown in FIG. 1A to FIG. 1D and FIG. 2A to FIG. 2D, "semiconductor wafer preparing step", "glass film forming step", "oxide film removing step", "roughened surface region forming step", "electrode forming step", and "semiconductor wafer cutting step" in this order. Hereinafter, the method of manufacturing a semiconductor device according to the embodiment 1 is explained in the order of steps.

(a) Semiconductor Wafer Preparing Step

Firstly, a $p^+$ type diffusion layer 112 is formed by diffusing a p type impurity from one surface of an $n^-$ type semiconductor wafer (for example, an $n^-$ type silicon wafer having a diameter of 4 inches) 110, and an $n^+$ type diffusion layer 114 is formed by diffusing an n type impurity from the other surface of the $n^-$ type semiconductor wafer 110 thus preparing a semiconductor wafer in which a pn junction arranged parallel to a main surface of the semiconductor wafer is formed. Thereafter, oxide films 116, 118 are formed by thermal oxidation on a surface of the $p^+$ type diffusion layer 112 and a surface of the $n^+$ type diffusion layer 114 respectively (see FIG. 1A).

Next, a predetermined opening portion is formed on the oxide film 116 at a predetermined position by photo etching. After etching the oxide film, subsequently, the semiconductor wafer is etched thus forming a trench 120 having a depth which goes beyond the pn junction as measured from one surface of the semiconductor wafer (see FIG. 1B). At this stage of operation, a pn junction exposed portion A is formed on an inner surface of the trench.

Figure 1A:
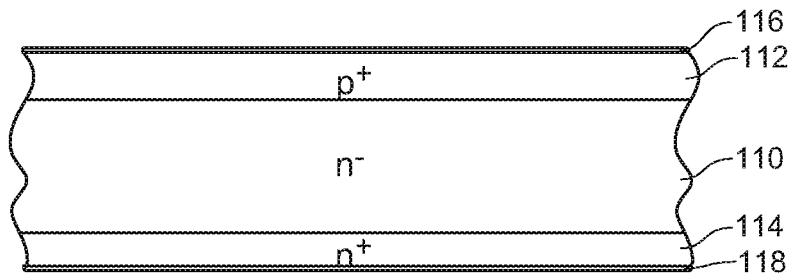
FIG. 1
Figure 1B:
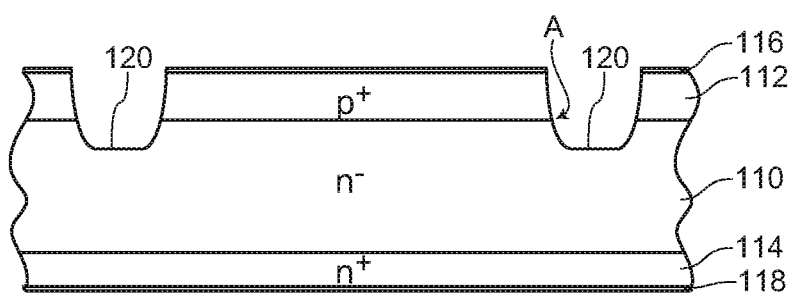
Figure 1C:
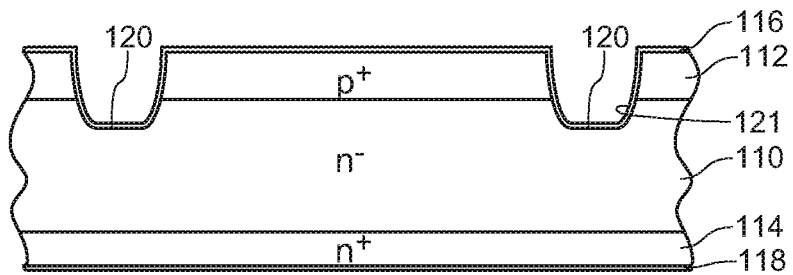

Next, a base insulating film 121 formed of a silicon oxide film is formed on an inner surface of the trench 120 by thermal oxidation using dry oxygen (Dry $O_2$) (see FIG. 1C). A thickness of the base insulating film 121 is set to a value which falls within a range of 5 nm to 60 nm (for example, 20 nm). The base insulating film 121 is formed such that the semiconductor wafer is put into a diffusion furnace and, thereafter, thermal oxidation treatment is performed by supplying an oxygen gas to the diffusion furnace at a temperature of 900° C. for 10 minutes. When the thickness of the base insulating film 121 is less than 5 nm, there is a possibility that an effect of preventing the increase of a leak current in a semiconductor device in a BT test cannot be acquired. On the other hand, when the thickness of the base insulating film 121 exceeds 60 nm, there is a possibility that a glass film cannot be formed by electrophoresis in a next glass film forming step.

(b) Glass Film Forming Step

Figure 1D:
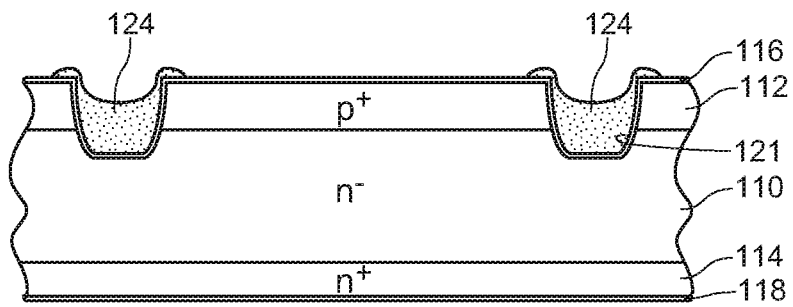

Next, a glass film 124 is formed on an inner surface of the trench 120 and a surface of the semiconductor wafer in the vicinity of the trench 120 by electrophoresis, and the glass film 124 is densified by being baked (see FIG. 1D).

In the method of manufacturing a semiconductor device according to the embodiment 1, in forming the glass film 124 by electrophoresis, basically, the glass film 124 is formed on a glass film forming scheduled surface by electrophoresis in the same manner as a conventional method of manufacturing a semiconductor device. That is, as shown in FIG. 3A and FIG. 3B, the glass film 124 is formed on the glass film forming scheduled surface by electrophoresis in a state where a suspension 12 formed by suspending fine glass particles in a solvent is stored in a tank 10, a first electrode plate 14 connected to a minus terminal and a second electrode plate 16 connected to a plus terminal are arranged in the inside of the tank 10 so as to opposedly face each other in a state where the first electrode plate 14 and the second electrode plate 16 are immersed in the suspension 12, and a semiconductor wafer W is arranged between the first electrode plate 14 and the second electrode plate 16 in a posture where a glass film forming scheduled surface (inner surface of the trench in FIG. 3) is directed to a first electrode plate 14 side.

However, in the method of manufacturing a semiconductor device according to the embodiment 1, unlike the case of a conventional method of manufacturing a semiconductor device, a ring-shaped electrode plate 18 with the opening having a diameter smaller than a diameter of the semiconductor wafer W is disposed between the first electrode plate 14 and the second electrode plate 16, the semiconductor wafer W is arranged between the ring-shaped electrode plate 18 and the second electrode plate 16, and the glass film is formed on the glass film forming scheduled surface in a state where a potential being biased more to a potential V1 of the first electrode plate 14 than to a potential V2 of the second electrode plate 16 (a potential lower than the potential V2 of the second electrode plate 16) is applied to the ring-shaped electrode plate 18.

As fine glass particles, for example, lead borosilicate glass which contains PbO, $B_2O_3$ and $SiO_2$ as main components is used. As a solvent, a solvent formed by adding a nitric acid to acetone is used, for example. As a voltage applied between the first electrode plate 14 and the second electrode plate 16, a voltage of 10V to 800V (for example, 400V) is applied.

In the method of manufacturing a semiconductor device according to the embodiment 1, as shown in FIG. 3A and FIG. 3B, the glass film is formed on the glass film forming scheduled surface in a state where a potential equal to a potential V1 of the first electrode plate 14 is applied to the ring-shaped electrode plate 18.

In the method of manufacturing a semiconductor device according to the embodiment 1, with respect to an opening of the ring-shaped electrode plate 18, assuming a diameter of the semiconductor wafer W as D1 (mm) (see FIG. 4A) and a diameter of the opening of the ring-shaped electrode plate 18 as D2 (mm) (see FIG. 4B), the diameter D2 is set to a value which satisfies a relationship of "D1 (mm)−50 mm≤D2 (mm)≤D1 (mm)−1 mm".

Further, a width of the ring-shaped electrode plate in the radial direction (an outer diameter D3 of the ring-shaped electrode plate 18—a diameter D2 of the opening of the ring-shaped electrode plate 18) is set to a value which falls within a range of 5 mm to 15 mm. The outer diameter D3 of the ring-shaped electrode plate 18 is set smaller than a diameter D4 of the second electrode plate 16 (see FIG. 4C).

In performing the glass film forming step, a glass film forming apparatus having the following constitution is used. That is, the glass film forming apparatus (the glass film forming apparatus 1 according to the embodiment 1) includes:

a tank 10 in which a suspension 12 formed by suspending fine glass particles in a solvent is stored; a first electrode plate 14 and a second electrode plate 16 which are disposed in the tank 10 in a state where the first electrode plate 14 and the second electrode plate 16 opposedly face each other; a ring-shaped electrode plate 18 which is disposed between the first electrode plate 14 and the second electrode plate 16, and has an opening having a diameter smaller than a diameter of the semiconductor wafer W; a semiconductor wafer arranging jig (not shown in the drawings) for arranging the semiconductor wafer W at a predetermined position between the ring-shaped electrode plate 18 and the second electrode plate 16; and a power source device 20 which applies potentials to the first electrode plate 14, the second electrode plate 16 and the ring-shaped electrode plate 18 respectively such that the potential applied to the ring-shaped electrode plate 18 is biased more to the potential of the first electrode plate 14 than to the potential of the second electrode plate 16 (see FIG. 3).

(c) Oxide Film Removing Step

Next, a photoresist 126 is formed so as to cover a surface of the glass film 124. Thereafter, the oxide film 116 is etched using the photoresist 126 as a mask so that the oxide film 116 at a portion 130 where a Ni-plating electrode film is to be formed is removed (see FIG. 2A).

(d) Roughened Surface Region Forming Step

Figure 2A:
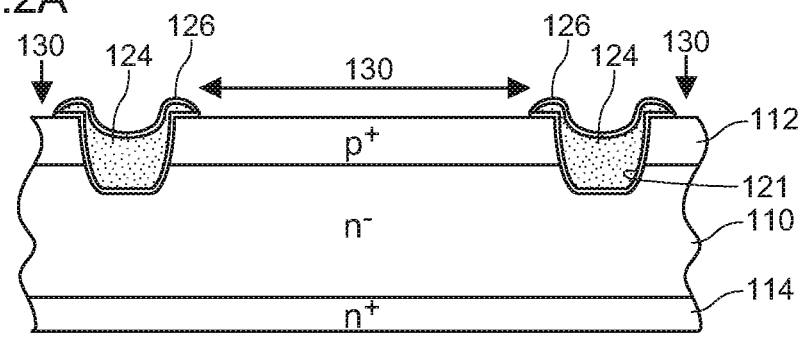
Figure 2B:
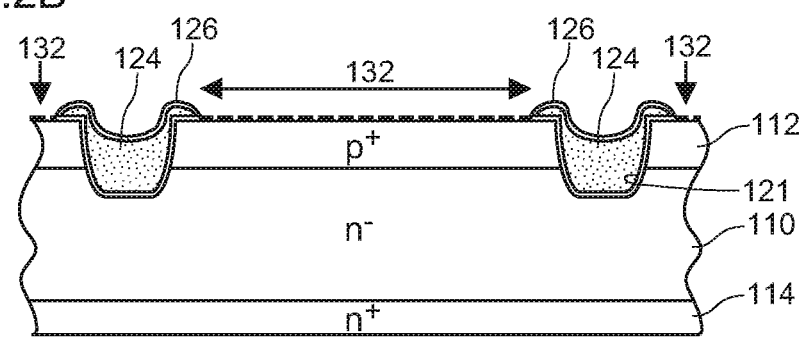

Next, a surface of the semiconductor wafer at the portion 130 where the Ni-plating electrode film is to be formed is subjected to surface roughening treatment thus forming a roughened surface region 132 for enhancing adhesiveness between a Ni plating electrode and the semiconductor wafer (see FIG. 2B).

(e) Electrode Forming Step

Figure 2C:
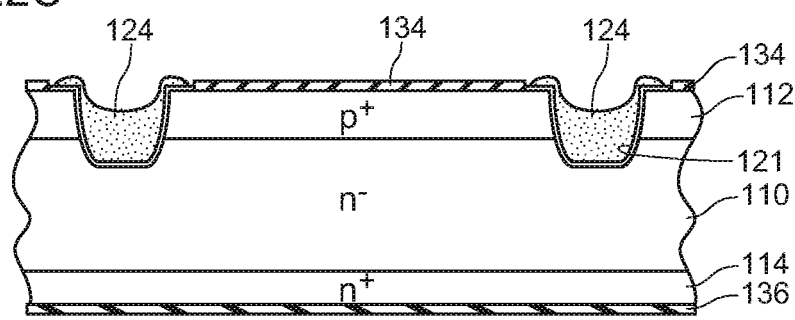

Next, Ni plating is applied to the semiconductor wafer thus forming an anode electrode 134 on the roughened surface region 132 and forming a cathode electrode 136 on the other surface of the semiconductor wafer (see FIG. 2C).

(f) Semiconductor Wafer Cutting Step

Figure 2D:
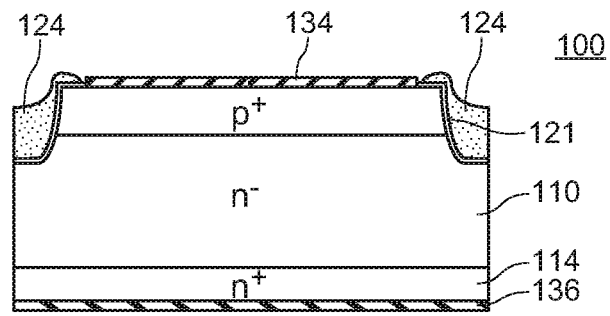

Next, the semiconductor wafer is cut by dicing or the like at a center portion of the glass film 124 thus dividing the semiconductor wafer into chips whereby semiconductor devices (mesa pn diodes) 100 are manufactured (see FIG. 2D).

The semiconductor device (mesa pn diode) 100 can be manufactured through the above-mentioned steps.

Hereinafter, advantageous effects acquired by the method of manufacturing a semiconductor device and the glass film forming apparatus according to the embodiment 1 are explained with reference to FIG. 5A to FIG. 5C. In FIG. 5A to FIG. 5C, an arrow indicates the flow of fine glass particles.

In the method of manufacturing a semiconductor device according to a comparison example 1, a glass film is formed on an inner surface of a trench of a semiconductor wafer without forming a base insulating film on an inner surface of the trench of the semiconductor wafer (see FIG. 5A). In a method of manufacturing a semiconductor device according to a comparison example 2, a base insulating film is formed on an inner surface of a trench of a semiconductor wafer and, thereafter, a glass film is formed on the base insulating film. However, unlike the case of the method of manufacturing a semiconductor device according to the embodiment 1, a glass film is formed without mounting a ring-shaped electrode plate (see FIG. 5B). To the contrary, in the method of manufacturing a semiconductor device according to the embodiment 1, the glass film is formed in a state where the ring-shaped electrode plate is mounted (see FIG. 5C).

In the method of manufacturing a semiconductor device according to the embodiment 1, due to a function of the ring-shaped electrode plate, on an outer peripheral portion of the semiconductor wafer W, it is possible to correct the flow of fine glass particles which flows toward the outer side of the semiconductor wafer W in a radial direction to the flow of fine glass particles which flows toward the glass film forming scheduled surface of the semiconductor wafer W (see portions indicated by symbol C in FIG. 5B and FIG. 5C).

As has been explained heretofore, according to the method of manufacturing a semiconductor device of the embodiment 1, the ring-shaped electrode plate 18 with the opening having a diameter smaller than a diameter of the semiconductor wafer W is disposed between the first electrode plate 14 and the second electrode plate 16, the semiconductor wafer W is arranged between the ring-shaped electrode plate 18 and the second electrode plate 16, and the glass film is formed on the glass film forming scheduled surface in a state where a potential being biased more to a potential V1 of the first electrode plate 14 than to a potential V2 of the second electrode plate 16 (a potential lower than the potential V2 of the second electrode plate 16) is applied to the ring-shaped electrode plate 18 (see FIG. 3). Accordingly, on an outer peripheral portion of the semiconductor wafer W, it is possible to correct the flow of fine glass particles toward the outer side of the semiconductor wafer W in a radial direction to the flow of fine glass particles toward the glass film forming scheduled surface of the semiconductor wafer W (see portions indicated by symbol C in FIG. 5B and FIG. 5C). As a result, according to the method of manufacturing a semiconductor device of the embodiment 1, even when the glass film forming step is performed using the semiconductor wafer where the base insulating film is formed on the glass film forming scheduled surface as the semiconductor wafer, lowering of deposition efficiency of fine glass particles on the outer peripheral portion of the semiconductor wafer can be suppressed and hence, highly reliable semiconductor device can be manufactured with high productivity.

Further, according to the method of manufacturing a semiconductor device of the embodiment 1, the glass film is formed on the glass film forming scheduled surface in a state where a potential equal to a potential of the first electrode plate 14 is applied to the ring-shaped electrode plate 18. Accordingly, the glass film can be formed using the simple power source device.

According to the method of manufacturing a semiconductor device of the embodiment 1, the diameter D2 of the opening formed in the ring-shaped electrode plate 18 is set to a size which satisfies a relationship of "D1 (mm)−50 mm≤D2 (mm)≤D1 (mm)−1 mm". Accordingly, the flow of fine glass particles on the outer peripheral portion of the semiconductor wafer W can be effectively corrected.

According to the glass film forming apparatus 1 of the embodiment 1, the ring-shaped electrode plate 18 with the opening having a diameter smaller than the diameter of the semiconductor wafer W is disposed between the first electrode plate 14 and the second electrode plate 16, the semiconductor wafer W is arranged between the ring-shaped electrode plate 18 and the second electrode plate 16, and the glass film can be formed on the glass film forming scheduled surface in a state where a potential being biased more to a potential V1 of the first electrode plate 14 than to a potential V2 of the second electrode plate 16 (a potential lower than the potential V2 of the second electrode plate 16) is applied to the ring-shaped electrode plate 18 (see FIG. 3). Accordingly, on the outer peripheral portion of the semiconductor wafer W, it is possible to correct the flow of fine glass particles toward the outer side of the semiconductor wafer W in a radial direction to the flow of fine glass particles toward the glass film forming scheduled surface of the semiconductor wafer W (see portions indicated by symbol C in FIG. 5B and FIG. 5C). As a result, according to the glass film forming apparatus 1 of the embodiment 1, even when the glass film forming step is performed using the semiconductor wafer where the base insulating film is formed on the glass film forming scheduled surface as the semiconductor wafer, lowering of deposition efficiency of the fine glass particles on the outer peripheral portion of the semiconductor wafer can be suppressed and hence, highly reliable semiconductor device can be manufactured with high productivity.

Embodiment 2

A method of manufacturing a semiconductor device according to an embodiment 2 basically includes steps substantially equal to the steps of the method of manufacturing a semiconductor device according to the embodiment 1. However, the method of manufacturing a semiconductor device according to the embodiment 2 differs from the method of manufacturing a semiconductor device according to the embodiment 1 in the content of the glass film forming step. That is, in the method of manufacturing a semiconductor device according to the embodiment 2, as shown in FIG. 6A and FIG. 6B, in the glass film forming step, the glass film is formed on the glass film forming scheduled surface in a state where a potential V3 (for example, a minus potential slightly higher than V1) between a potential V1 (minus potential) of a first electrode plate 14 and a potential V2 (plus potential) of a second electrode plate 16 is applied to the ring-shaped electrode plate 18.

In this manner, the method of manufacturing a semiconductor device according to the embodiment 2 differs from the method of manufacturing a semiconductor device according to the embodiment 1 in the content of the glass film forming step. However, the semiconductor wafer W is arranged between the ring-shaped electrode plate 18 and the second electrode plate 16, and the glass film is formed on the glass film forming scheduled surface in a state where a potential being biased more to a potential V1 of the first electrode plate 14 than to a potential V2 of the second electrode plate 16 (a potential lower than the potential V2 of the second electrode plate 16) is applied to the ring-shaped electrode plate 18. Accordingly, in the same manner as the method of manufacturing a semiconductor device according to the embodiment 1, even when the glass film forming step is performed using the semiconductor wafer where the base insulating film is formed on the glass film forming scheduled surface as the semiconductor wafer, lowering of deposition efficiency of fine glass particles on the outer peripheral portion of the semiconductor wafer can be suppressed and hence, highly reliable semiconductor devices can be manufactured with high productivity.

Further, according to the method of manufacturing a semiconductor device according to the embodiment 2, the glass film is formed on the glass film forming scheduled surface in a state where a potential V3 between a potential V1 of the first electrode plate 14 and a potential V2 of the second electrode plate 16 is applied to the ring-shaped electrode plate 18. Accordingly, by controlling the potential V3 applied to the ring-shaped electrode plate 18 to a desired voltage, lowering of deposition efficiency on the outer peripheral portion of the semiconductor wafer can be further suppressed and hence, the highly reliable semiconductor device can be manufactured with higher productivity.

In performing the glass film forming step, a glass film forming apparatus 2 (the glass film forming apparatus 2 according to the embodiment 2) is used where the power source device 20 of the glass film forming apparatus 1 used in the embodiment 1 is replaced with a power source device 22 for applying a desired potential V3 between a potential V1 of the first electrode plate 14 and a potential V2 of the second electrode plate 16 to the ring-shaped electrode plate 18.

Embodiment 3

A method of manufacturing a semiconductor device according to an embodiment 3 basically includes steps substantially equal to the steps of the method of manufacturing a semiconductor device according to the embodiment 1. However, unlike the method of manufacturing a semiconductor device according to the embodiment 1, in the method of manufacturing a semiconductor device according to the embodiment 3, a planar pn diode is manufactured as the semiconductor device. Corresponding to the manufacture of the planar pn diode as the semiconductor device, as shown in FIG. 7A to FIG. 7D and FIG. 8A to FIG. 8D, the semiconductor wafer preparing step includes: a step of forming a pn junction exposed portion on a surface of a semiconductor wafer W; and a step of forming a base insulating film 218 on a surface of the semiconductor wafer W such that the base insulating film 218 covers the pn junction exposed portion.

The method of manufacturing a semiconductor device according to the embodiment 3 includes, as shown in FIG. 7A to FIG. 7D and FIG. 8A to FIG. 8D, "semiconductor wafer preparing step", "glass film forming step", "etching step", "electrode forming step", and "semiconductor wafer cutting step" in this order. Hereinafter, the method of manufacturing a semiconductor device according to the embodiment 3 is explained in the order of steps.

(a) Semiconductor Wafer Preparing Step

Figure 7A:
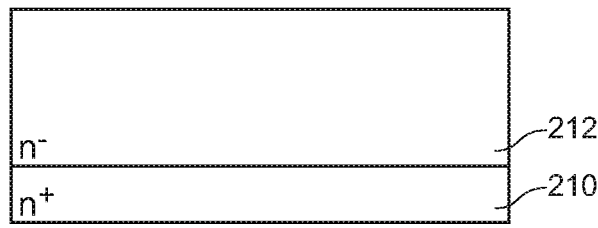
Figure 7B:
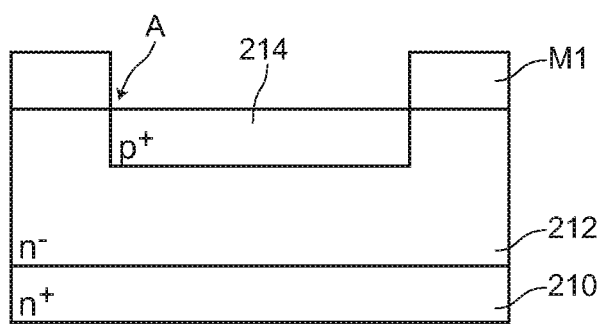
Figure 7C:
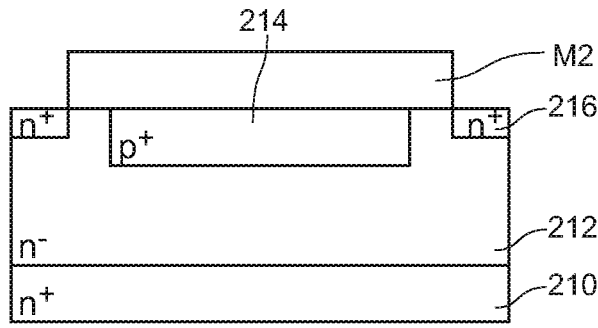

Firstly, a semiconductor wafer where an $n^-$ type epitaxial layer 212 is laminated onto an $n^+$ type semiconductor wafer 210 is prepared (see FIG. 7A).

Next, a mask M1 is formed on the $n^-$ type epitaxial layer 212 and, thereafter, a p-type impurity (for example, boron ions) is introduced into a predetermined region on a surface of the n type epitaxial layer 212 through the mask M1 by an ion implantation method. Then, a $p^+$ type diffusion layer 214 is formed by thermal diffusion (see FIG. 7B). At this stage of operation, a pn junction exposed portion A is formed on a surface of the semiconductor wafer W.

Next, the mask M1 is removed from the n⁻ type epitaxial layer 212 and a mask M2 is formed on the n⁻ type epitaxial layer 212 and, thereafter, an n-type impurity (for example, arsenic ions) is introduced into a predetermined region on a surface of the n⁻ type epitaxial layer 212 through the mask M2 by an ion implantation method. Then, an n⁺ type diffusion layer 216 is formed by thermal diffusion (see FIG. 7C).

Figure 7D:
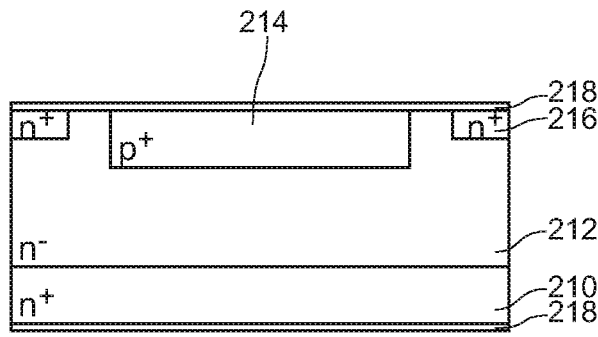

Next, the mask M2 is removed from the n⁻ type epitaxial layer 212 and, thereafter, a base insulating film 218 formed of a silicon oxide film is formed on a surface of the n⁻ type epitaxial layer 212 (and a back surface of the n⁺ type silicon substrate 210) by thermal oxidation using dry oxygen (Dry O₂) (see FIG. 7D).

A thickness of the base insulating film 218 is set to a value which falls within a range of 5 nm to 60 nm (for example, 20 nm). The base insulating film 218 is formed such that the semiconductor wafer W is put into a diffusion furnace and, thereafter, thermal oxidation treatment is performed by supplying an oxygen gas to the diffusion furnace at a temperature of 900° C. for 10 minutes. When the thickness of the base insulating film 218 is less than 5 nm, there is a possibility that an effect of preventing the increase of a leak current in a semiconductor device in a BT test cannot be acquired. On the other hand, when the thickness of the base insulating film 218 exceeds 60 nm, there is a possibility that a glass film cannot be formed by electrophoresis in a next glass layer forming step.

(b) Glass Film Forming Step

Figure 8A:
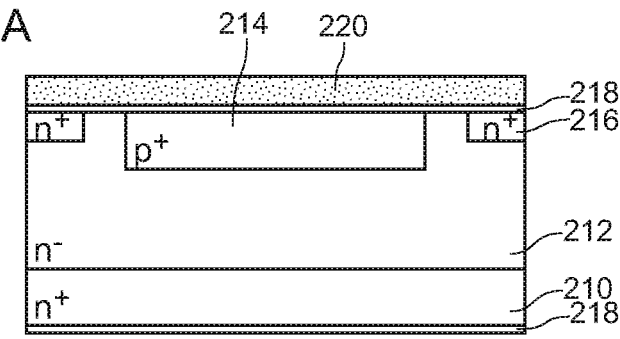
Figure 8B:
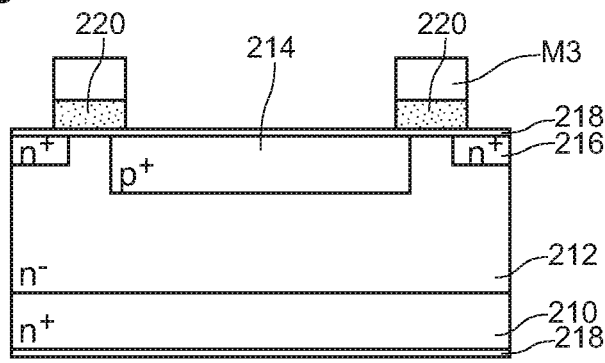

Next, a glass film 220 is formed on a surface of the base insulating film 218 by electrophoresis in the same manner as the case of the embodiment 1 and, thereafter, the glass film 220 is densified by being baked (see FIG. 8A).

(c) Etching Step

Figure 8C:
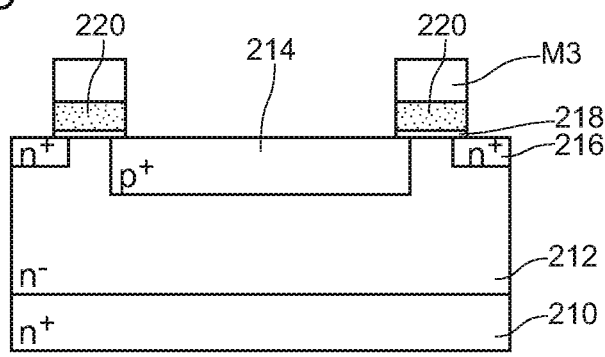

Next, a mask M3 is formed on a surface of the glass film 220 and, thereafter, the glass film 220 is etched (see FIG. 8B) and, subsequently, the base insulating film 218 is etched (see FIG. 8C). With such a step, the base insulating film 218 and the glass film 220 are formed in a predetermined region on a surface of the n⁻ type epitaxial layer 212.

(d) Electrode Forming Step

Next, the mask M3 is removed from the glass film 220 and, thereafter, an anode electrode 222 is formed in a region surrounded by the glass film 220 on a surface of the semiconductor wafer, and a cathode electrode 224 is formed on a back surface of the semiconductor wafer.

(e) Semiconductor Wafer Cutting Step

Figure 8D:
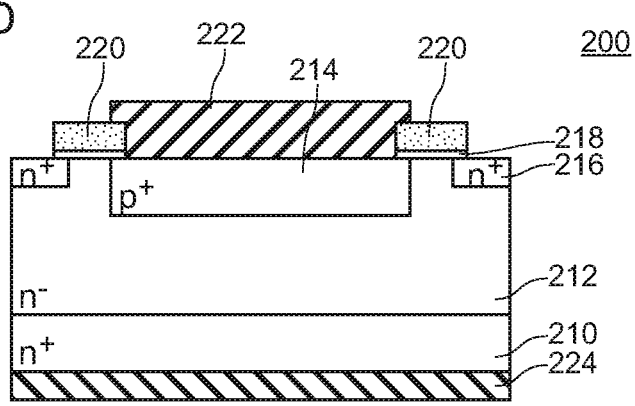

Next, the semiconductor wafer is cut by dicing or the like thus dividing the semiconductor wafer into chips whereby semiconductor devices (planar pn diodes) 200 are manufactured (see FIG. 8D).

The semiconductor device (planar pn diode) 200 can be manufactured through the above-mentioned steps.

Hereinafter, advantageous effects acquired by the method of manufacturing a semiconductor device according to the embodiment 3 are explained with reference to FIG. 9A to 9C. In FIG. 9A to 9C, an arrow indicates the flow of fine glass particles.

In the method of manufacturing a semiconductor device according to a comparison example 3, a glass film is formed on a semiconductor wafer without forming a base insulating film on a surface of the semiconductor wafer (see FIG. 9A). In a method of manufacturing a semiconductor device according to a comparison example 4, a base insulating film is formed on a surface of a semiconductor wafer and, thereafter, a glass film is formed on the base insulating film. However, unlike the case of the method of manufacturing a semiconductor device according to the embodiment 3, a glass film is formed without mounting a ring-shaped electrode plate (see FIG. 9B). On the other hand, in the method of manufacturing a semiconductor device according to the embodiment 3, the glass film is formed in a state where the ring-shaped electrode plate is mounted (see FIG. 9C).

In the method of manufacturing a semiconductor device according to the embodiment 3, due to a function of the ring-shaped electrode plate, on an outer peripheral portion of the semiconductor wafer W, it is possible to correct the flow of fine glass particles which flows at a steep angle toward the outer side of the semiconductor wafer W in a radial direction to the flow of fine glass particles which flows toward the glass film forming scheduled surface of the semiconductor wafer W (see portions indicated by symbol C in FIG. 9B and FIG. 9C).

As has been explained heretofore, the method of manufacturing a semiconductor device according to the embodiment 3 differs from the method of manufacturing a semiconductor device according to the embodiment 1 with respect to a point that a planar pn diode is manufactured as a semiconductor device. However, the semiconductor wafer W is arranged between the ring-shaped electrode plate 18 and the second electrode plate 16, and the glass film is formed on the glass film forming scheduled surface in a state where a potential being biased more to a potential V1 of the first electrode plate 14 than to a potential V2 of the second electrode plate 16 (a potential lower than the potential V2 of the second electrode plate 16) is applied to the ring-shaped electrode plate 18. Accordingly, on an outer peripheral portion of the semiconductor wafer W, it is possible to correct the flow of fine glass particles toward the outer side of the semiconductor wafer W in a radial direction to the flow of fine glass particles toward the glass film forming scheduled surface of the semiconductor wafer W (see portions indicated by symbol C in FIG. 9B and FIG. 9C). As a result, according to the method of manufacturing a semiconductor device according to the embodiment 3, in the same manner as the method of manufacturing a semiconductor device according to the embodiment 1, even when the glass film forming step is performed using the semiconductor wafer where the base insulating film is formed on the glass film forming scheduled surface as the semiconductor wafer, lowering of deposition efficiency of the fine glass particles on the outer peripheral portion of the semiconductor wafer can be suppressed and hence, highly reliable semiconductor devices can be manufactured with high productivity.

Embodiment 4

A method of manufacturing a semiconductor device according to an embodiment 4 basically includes steps substantially equal to the steps of the method of manufacturing a semiconductor device according to the embodiment 1. However, the method of manufacturing a semiconductor device according to the embodiment 4 differs from the case of the method of manufacturing a semiconductor device according to the embodiment 1 in the composition of fine glass particles used in a glass film forming step. That is, in the method of manufacturing a semiconductor device according to the embodiment 4, as fine glass particles used in the glass film forming step, fine glass particles made of lead free glass are used in place of fine glass particles made of lead borosilicate glass. Further, along with the use of such fine glass particles, a glass film is formed on a glass film forming scheduled surface in a state where a plus potential is applied to the first electrode plate 14 and a minus potential is applied to the second electrode plate 16, and a potential biased more to a potential V1 of the first electrode plate 14 than to a potential V2 of the second electrode plate 16 (a potential higher than the potential V2 of the second electrode plate 16) is applied to the ring-shaped electrode plate 18.

In this manner, the method of manufacturing a semiconductor device according to the embodiment 4 differs from the method of manufacturing a semiconductor device according to the embodiment 1 in the composition of fine glass particles used in the glass film forming step. However, the semiconductor wafer W is arranged between the ring-shaped electrode plate 18 and the second electrode plate 16, and the glass film is formed on the glass film forming scheduled surface in a state where a potential being biased more to a potential V1 of the first electrode plate 14 than to a potential V2 of the second electrode plate 16 (a potential higher than the potential V2 of the second electrode plate 16) is applied to the ring-shaped electrode plate 18. Accordingly, in the same manner as the method of manufacturing a semiconductor device according to the embodiment 1, even when the glass film forming step is performed using the semiconductor wafer where the base insulating film is formed on the glass film forming scheduled surface as the semiconductor wafer, lowering of deposition efficiency of fine glass particles on the outer peripheral portion of the semiconductor wafer can be suppressed and hence, highly reliable semiconductor device can be manufactured with high productivity.

According to the method of manufacturing a semiconductor device of the embodiment 4, as fine glass particles used in the glass film forming step, fine glass particles made of lead free glass are used in place of fine glass particles made of lead borosilicate glass. Accordingly, in a step of densifying a glass film by baking the glass film, the generation of bubbles from a boundary face between the semiconductor wafer and the glass film can be suppressed and, at the same time, it is also possible to acquire an advantageous effect that a semiconductor device having a low reverse-directional leak current can be manufactured in a stable manner.

In the method of manufacturing a semiconductor device according to the embodiment 4, as fine glass particles made of lead free glass, for example, the following fine glass particles can be used. That is, the method of manufacturing a semiconductor device according to the embodiment 4 uses fine glass particles produced from a melt obtained by melting a raw material which contains at least $SiO_2$, $Al_2O_3$, $B_2O_3$, ZnO, and at least two oxides of alkaline earth metals selected from a group consisting of CaO, MgO and BaO, and substantially contains none of Pb, As, Sb, Li, Na and K.

As such fine glass particles, it is preferable to use fine glass particles where the content of $SiO_2$ falls within a range of 41.1 mol % to 61.1 mol %, the content of $Al_2O_3$ falls within a range of 7.4 mol % to 17.4 mol %, the content of $B_2O_3$ falls within a range of 5.8 mol % to 15.8 mol %, the content of ZnO falls within a range of 3.0 mol % to 24.8 mol %, the content of oxide of alkaline earth metal falls within a range of 5.5 mol % to 15.5 mol %, and the content of nickel oxide falls within a range of 0.01 mol % to 2.0 mol %. Further, as an oxide of alkaline earth metal, it is possible to preferably use an oxide where the content of CaO falls within a range of 2.8 mol % to 7.8 mol %, the content of MgO falls within a range of 1.1 mol % to 3.1 mol %, and the content of BaO falls within a range of 1.7 mol % to 4.7 mol %.

As a solvent, a solvent formed by adding a nitric acid to a mixed solvent of isopropyl alcohol and ethyl acetate is used, for example.

In the method of manufacturing a semiconductor device according to the embodiment 4, in performing a glass film forming step, the glass film forming apparatus 1 used in the embodiment 1 is used as a glass film forming apparatus. As fine glass particles used in the glass film forming step, fine glass particles made of lead free glass are used in place of fine glass particles made of lead borosilicate glass. Accordingly, along with the use of such fine glass particles, a glass film is formed on a glass film forming scheduled surface in a state where a plus potential is applied to the first electrode plate 14 and a minus potential is applied to the second electrode plate 16, and a potential biased more to a potential V1 of the first electrode plate 14 than to a potential V2 of the second electrode plate 16 (a potential higher than the potential V2 of the second electrode plate 16) is applied to the ring-shaped electrode plate 18.

Test Examples

Hereinafter, the present invention is more specifically explained in accordance with test examples.

The test examples are the examples for evaluating effects acquired by a ring-shaped electrode plate.

1. Preparation of Specimens (1) Specimen 1

Firstly, a 4-inch silicon wafer having a surface on which a base insulating film having a film thickness of 27 nm is formed is prepared by thermally oxidizing the surface of the silicon wafer. Next, a glass film is formed on the base insulating film of the silicon wafer in a glass film forming step basically equal to the glass film forming step described in the embodiment 1, and such a silicon wafer is used as a specimen 1 (example).

(2) Specimen 2

Firstly, a 4-inch silicon wafer having a surface on which a base insulating film having a film thickness of 27 nm is formed is prepared by thermally oxidizing the surface of the silicon wafer. Next, a glass film is formed on the base insulating film of the silicon wafer in a glass film forming step basically equal to the glass film forming step of the case where the specimen 1 is prepared except for that a ring-shaped electrode plate is not provided, and such a silicon wafer is used as a specimen 2 (comparison example).

(3) Specimen 3

A specimen is prepared in the same manner as the case where the specimen 1 is prepared except for that a film thickness of a formed base insulating film is 45 nm, and such a specimen is used as a specimen 3 (example).

(4) Specimen 4

A specimen is prepared in the same manner as the case where the specimen 2 is prepared except for that a film thickness of a formed base insulating film is 45 nm, and such a specimen is used as a specimen 4 (comparison example).

2. Evaluation Method

Surfaces of the respective specimens (specimens 1 to 4) are observed using a microscope, and a width of a region where a glass film is not formed on an outer peripheral portion of a silicon wafer (a glass film non-formed region width) is measured, and an effect of a ring-shaped electrode plate is evaluated.

3. Result of Evaluation

FIG. 10A and FIG. 10B is a view showing the result of evaluation with respect to the specimens 1 and 2. FIG. 11A and FIG. 11B is a view showing the result of evaluation with respect to the specimens 3 and 4. In these drawings, symbol B indicates a glass film non-formed region width.

As can be also clearly understood from FIG. 10 and FIG. 11, the following is confirmed. In the specimens (the specimens 1 and 3) where the glass film is formed in a state where the ring-shaped electrode plate is provided, compared to the specimens (the specimens 2 and 4) where the glass film is formed without providing the ring-shaped electrode plate, the glass film non-formed width region B on the outer peripheral portion of the silicon wafer is narrow, and the glass film is formed so as to reach an area in the vicinity of an outermost periphery of the silicon wafer.

Although the method of manufacturing a semiconductor device and the glass film forming apparatus according to the present invention are explained based on the above-mentioned embodiments, the present invention is not limited to those embodiments, and the present invention can be carried out without departing from the gist of the present invention, and the following modifications are also conceivable, for example.

(1) In the above-mentioned respective embodiments, the ring-shaped electrode plate having a smaller circular outer shape than the second electrode plate 16 is used as the ring-shaped electrode plate 18. However, the present invention is not limited to such a ring-shaped electrode plate. For example, as shown in FIG. 12A, a ring-shaped electrode plate (modification 1) having a larger circular outer shape than the second electrode plate 16 may be also used. Still further, as shown in FIG. 12B, a ring-shaped electrode plate (modification 2) having a larger rectangular outer shape than the second electrode plate 16 may be used.

(2) In the above-mentioned embodiment 1, the minus electrode plate and the plus electrode plate are used as the first electrode plate 14 and the second electrode plate 16 respectively, while in the above-mentioned embodiment 4, the plus electrode plate and the minus electrode plate are used as the first electrode plate 14 and the second electrode plate 16 respectively. However, which one of the first electrode plate and the second electrode plate is set as the minus electrode plate or the plus electrode plate can be determined as desired depending on kinds of fine glass particles, a solvent and an electrolysis to be added or the combination of the fine glass particles, the solvent and the electrolyte to be added.

(3) In the above-mentioned embodiment 1, the glass film is formed in a state where a potential equal to a potential V1 of the first electrode plate 14 is applied to the ring-shaped electrode plate 18. In the above-mentioned embodiment 2, the glass film is formed in a state where a potential V3 (for example, a minus potential slightly higher than V1) between a potential V1 of the first electrode plate 14 and a potential V2 of the second electrode plate 16 is applied to the ring-shaped electrode plate 18. However, the present invention is not limited to such cases. A range of the potential applied to the ring-shaped electrode plate 18 is not limited to ranges described in the above-mentioned embodiment 1 and embodiment 2.

When the minus electrode plate and the plus electrode plate are used as the first electrode plate 14 and the second electrode plate 16 respectively, as shown in FIG. 13A, a glass film may be formed in a state where, to the ring-shaped electrode plate 18, a predetermined potential biased more to a potential V1 of the first electrode plate 14 than to a potential V2 of the second electrode plate 16 (for example, a predetermined potential lower than the potential V1 of the first electrode plate 14, a potential equal to the potential V1 of the first electrode plate 14, a predetermined potential between the potential V1 of the first electrode plate 14 and the potential V2 of the second electrode plate 16 (excluding a potential equal to the potential V2 of the second electrode plate 16) or the like) is applied.

On the other hand, when the plus electrode plate and the minus electrode plate are used as the first electrode plate 14 and the second electrode plate 16 respectively, as shown in FIG. 13B, a glass film may be formed in a state where, to the ring-shaped electrode plate 18, a predetermined potential biased more to a potential V1 of the first electrode plate 14 than to a potential V2 of the second electrode plate 16 (for example, a predetermined potential higher than the potential V1 of the first electrode plate 14, a potential equal to the potential V1 of the first electrode plate 14, a predetermined potential between the potential V1 of the first electrode plate 14 and the potential V2 of the second electrode plate 16 (excluding a potential equal to the potential V2 of the second electrode plate 16) or the like) is applied.

(4) In the above-mentioned embodiment 3, the glass film is formed on the whole surface of the base insulating film formed on the surface of the semiconductor wafer and, thereafter, the glass film is removed by etching with respect to the regions other than the glass film forming region. However, the present invention is not limited to such formation of the glass film. For example, the base insulating film 218 may be formed on the surface of the semiconductor wafer in the same manner as the case of the embodiment 3 (see FIG. 7A to 7D) and, further, a mask M4 may be formed in regions other than the glass film forming region on the surface of the base insulating film 218 and, thereafter, the glass film 220 may be formed on the surface of the base insulating film 218 by way of the mask M4 (see modification 3, FIG. 14A to FIG. 14D).

In the above-mentioned respective embodiments, the semiconductor wafer plate made of silicon is used as the semiconductor wafer. However, the present invention is not limited to such a semiconductor wafer plate. For example, a semiconductor wafer made of SiC, GaN, GaO or the like can be also used.

REFERENCE SIGNS LIST 1, 2, 9: glass film forming apparatus
10: tank
12: suspension
14: first electrode plate
16: second electrode plate
18: ring-shaped electrode plate
20, 22: power source device
100, 200, 202, 900: semiconductor device
110, 910: $n^-$ type semiconductor substrate
112, 912: $p^+$ type diffusion layer
114, 914: $n^-$ type diffusion layer
116, 118, 916, 918: oxide film
120, 920: trench
121, 218: base insulating film
124, 220, 924: glass film
126, 926: photoresist
130, 930: portion where Ni-plating electrode film is to be formed
132, 932: roughened surface region
134, 934: anode electrode
136, 936: cathode electrode
210: $n^+$ type semiconductor substrate
212: $n^-$ type epitaxial layer
214: $p^+$ type diffusion layer
216: $n^+$ type diffusion layer 222: anode electrode layer
224: cathode electrode layer
B: glass film non-formed region width
M1, M2, M3, M4: mask
V1: potential of first electrode plate
V2: potential of second electrode plate
V3: potential applied to ring-shaped electrode plate

The invention claimed is:

1. A method of manufacturing a semiconductor device comprising:
a semiconductor wafer preparing step of preparing a semiconductor wafer where a base insulating film is formed on a glass film forming scheduled surface; and
a glass film forming step of forming a glass film on the glass film forming scheduled surface by electrophoresis in a state where a first electrode plate and a second electrode plate are disposed so as to oppposedly face each other in a tank in which a suspension formed by suspending fine glass particles in a solvent is stored, wherein the first electrode plate and the second electrode plate are immersed in the suspension, the semiconductor wafer is positioned between the first electrode plate and the second electrode plate without contacting the first and second electrode plates, and the glass film forming scheduled surface faces the first electrode plate, wherein
in the glass film forming step, a ring-shaped electrode plate having an opening which has a diameter smaller than a diameter of the semiconductor wafer is positioned between the first electrode plate and the second electrode plate, the semiconductor wafer is positioned between the ring-shaped electrode plate and the second electrode plate, and the glass film is formed on the glass film forming scheduled surface in which the ring-shaped electrode plate is biased to a potential closer to a potential of the first electrode plate than to a potential of the second electrode plate.

2. The method of manufacturing a semiconductor device according to claim 1, wherein the glass film is formed on the glass film forming scheduled surface in a state where the ring-shaped electrode plate is biased to a potential that is equal to the potential of the first electrode plate.

3. The method of manufacturing a semiconductor device according to claim 1, wherein the glass film is formed on the glass film forming scheduled surface in a state where a potential between the potential of the first electrode plate and the potential of the second electrode plate is applied to the ring-shaped electrode plate.

4. The method of manufacturing a semiconductor device according to claim 1, wherein assuming the diameter of the semiconductor wafer as D1 and the diameter of the opening formed in the ring-shaped electrode plate as D2, the diameter D2 is set to a value which satisfies a relationship $D1-50 \text{ mm} \leq D2 \leq D1-1 \text{ mm}$.

5. The method of manufacturing a semiconductor device according to claim 4, wherein an imaginary circle subscribed in the ring-shaped electrode plate has a diameter D3 which satisfies a relationship $D1 \leq D3$.

6. The method of manufacturing a semiconductor device according to claim 1, wherein the semiconductor wafer preparing step includes:
a step of preparing a semiconductor wafer having a pn junction parallel to a main surface thereof;
a step of forming a trench having a depth which goes beyond the pn junction as measured from one surface of the semiconductor wafer and forming a pn junction exposed portion on an inner surface of the trench; and
a step of forming the base insulating film on the inner surface of the trench such that the base insulating film covers the pn junction exposed portion.

7. The method of manufacturing a semiconductor device according to claim 1, wherein the semiconductor wafer preparing step includes:
a step of forming the pn junction exposed portion on a surface of the semiconductor wafer; and
a step of forming the base insulating film on the surface of the semiconductor wafer such that the base insulating film covers the pn junction exposed portion.

8. The method of manufacturing a semiconductor device according to claim 1, wherein a film thickness of the base insulating film falls within a range of 5 nm to 60 nm.

9. A glass film forming apparatus for forming a glass film by electrophoresis on a surface of a semiconductor wafer where a base insulating film is formed on a glass film forming scheduled surface, the glass film forming apparatus comprising:
a tank in which a suspension formed by suspending fine glass particles in a solvent is stored;
a first electrode plate and a second electrode plate which are disposed in the tank in a state where the first electrode plate and the second electrode plate opposedly face each other;
a ring-shaped electrode plate which is disposed between the first electrode plate and the second electrode plate, and has an opening having a diameter smaller than a diameter of the semiconductor wafer;
a semiconductor wafer arranging jig for arranging the semiconductor wafer at a predetermined position between the ring-shaped electrode plate and the second electrode plate without contacting the first and second electrode plates; and
a power source device which applies potentials to the first electrode plate, the second electrode plate, and the ring-shaped electrode plate respectively such that a potential applied to the ring-shaped electrode plate is biased more to a potential of the first electrode plate than to a potential of the second electrode plate.

* * * * *